(12) United States Patent
Hirukawa et al.

(10) Patent No.: US 7,537,945 B2
(45) Date of Patent: May 26, 2009

(54) SEMICONDUCTOR LASER DEVICE AND METHOD OF MANUFACTURING THE SAME, AND OPTICAL TRANSMISSION MODULE AND OPTICAL DISK APPARATUS USING THE SEMICONDUCTOR LASER DEVICE

(75) Inventors: Shuichi Hirukawa, Kyoto (JP);
Katsuhiko Kishimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 241 days.

(21) Appl. No.: 11/730,316

(22) Filed: Mar. 30, 2007

(65) Prior Publication Data

US 2007/0243644 A1    Oct. 18, 2007

(30) Foreign Application Priority Data

Apr. 12, 2006   (JP)   ............................. 2006-109971

(51) Int. Cl.
*H01L 21/00* (2006.01)
(52) U.S. Cl. ............................. 438/22; 438/29; 438/39
(58) Field of Classification Search .................. 438/22, 438/29, 39
See application file for complete search history.

(56) References Cited

U.S. PATENT DOCUMENTS

| | | | |
|---|---|---|---|
| 6,067,310 A * | 5/2000 | Hashimoto et al. | 372/49.01 |
| 6,703,254 B2 * | 3/2004 | Saitoh et al. | 438/29 |
| 6,810,055 B2 * | 10/2004 | Ohkubo | 372/46.01 |
| 2002/0126723 A1 * | 9/2002 | Ohkubo | 372/46 |
| 2007/0054431 A1 * | 3/2007 | Kamikawa et al. | 438/39 |
| 2007/0243644 A1 * | 10/2007 | Hirukawa et al. | 438/22 |

FOREIGN PATENT DOCUMENTS

| | | | |
|---|---|---|---|
| JP | 09148676 A | * | 6/1997 |
| JP | 10-084162 | | 3/1998 |
| JP | 10-209562 | | 8/1998 |
| JP | 2007287738 A | * | 11/2007 |

* cited by examiner

*Primary Examiner*—Laura M Menz
(74) *Attorney, Agent, or Firm*—Harness, Dickey & Pierce, P.L.C.

(57) ABSTRACT

Provided are a semiconductor laser device capable of stable operation at the time of high power output without damage to a resonator end surface and a method of manufacturing the same, as well as an optical transmission module and an optical disk apparatus using the semiconductor laser device. A method of manufacturing a semiconductor laser device includes a laser wafer formation step of forming a laser wafer at least having a semiconductor layer to form a resonator end surface, a cleavage step of cleaving the laser wafer in the atmosphere and forming a semiconductor laser element having the resonator end surface, a contact step of brining the resonator end surface in contact with a nitrogen containing gas containing 90-100 volume % nitrogen for one hour or longer, and a reflectance control film formation step of forming a reflectance control film in contact with the resonator end surface.

13 Claims, 12 Drawing Sheets

I

SEMICONDUCTOR LASER DEVICE AND METHOD OF MANUFACTURING THE SAME, AND OPTICAL TRANSMISSION MODULE AND OPTICAL DISK APPARATUS USING THE SEMICONDUCTOR LASER DEVICE

This nonprovisional application is based on Japanese Patent Application No. 2006-109971 filed with the Japan Patent Office on Apr. 12, 2006, the entire contents of which are hereby incorporated by reference.

BACKGROUND OF THE INVENTION

1. Field of the Invention

The present invention relates to a semiconductor laser device capable of stable operation at the time of high power output and a method of manufacturing the same, and an optical transmission module and an optical disk apparatus using the semiconductor laser device.

2. Description of the Background Art

In semiconductor laser devices widely used as light sources for optical disk apparatuses, optical communication apparatuses or the like, higher power output of the semiconductor laser devices is in increasing demand with increasing demand for higher-speed operation of optical disk apparatuses, optical communication apparatuses or the like. In achieving higher power output of a semiconductor laser device, COD (Catastrophic Optical Damage) degradation at a resonator end surface as a laser light emitting surface is a major concern and gives a significant effect on long-term reliability of high power operation. This COD degradation is thought to be caused by the following mechanism. More specifically, since a large number of surface states are present at the resonator end surface due to an impurity or the like, carriers are absorbed through these states to cause non-radiative recombination current to flow, thereby locally increasing the temperature. This temperature increase reduces the bandgap in the vicinity of the resonator end surface and, in addition, increases absorption of laser light and thus increases the end surface temperature. Repetition of such positive feedback causes melting of the resonator end surface and stops oscillation.

As one of the approaches to solve this problem, Japanese Patent Laying-Open No. 10-209562 discloses a semiconductor laser device and a method of manufacturing the same as follows. A semiconductor laser device shown in FIG. 24 is fabricated in the following manner. First, an n-GaAs buffer layer 502, an n-AlGaAs lower cladding layer 503, an AlGaAs lower guide layer 504, a quantum well active layer 505 formed by alternately stacking an InGaAs well layer (two layers) and a GaAs barrier layer (three layers), an AlGaAs upper guide layer 506, a p-AlGaAs upper cladding layer 507, a p-GaAs cap layer 508 are successively stacked on an n-GaAs substrate 501 by a metal-organic chemical vapor deposition (MOCVD) method.

Then, a stripe mask (not shown) formed of $SiO_2$ is fabricated by usual photolithography step and etching step. Using the stipe mask, p-GaAs cap layer 508 and p-AlGaAs upper cladding layer 507 are partially etched to form a ridge-like stripe portion.

Then, buried crystal growth is successively performed on a side portion of the stripe portion with an n-AlGaAs current block layer 509 and an n-GaAs current block layer 510 by a selective growth technique using the stripe mask. Then, after removal of the stripe mask, a p-GaAs cap layer 511 is crystal-grown. Finally, a p-side electrode (not shown) is deposited on the upper surface of p-GaAs cap layer 511 and an n-side electrode (not shown) is deposited on the back surface (the opposite surface to the surface on which each of the aforementioned semiconductor layers is stacked) of n-GaAs substrate 501.

The resulting stacked structure is cleaved as a whole in a bar shape with a width of the resonator length, and a low reflection film and a high reflection film (not shown) are respectively grown on the two exposed cleaved surfaces. The bar is then divided into chips, thereby completing a semiconductor laser device.

In this method of manufacturing a semiconductor laser device, cleavage into a bar shape as described above is performed in ultrahigh vacuum. This is because production of an impurity layer such as an oxide film at the resonator end surface exposed by the cleavage can effectively restrained as compared with cleavage in the atmosphere. In this case, light absorption by the interface state of the impurity layer at the resonator end surface can be reduced, so that the COD degradation at the end surface can be restrained. It is therefore thought that a semiconductor laser capable of stable operation at the time of high power output can be obtained.

Furthermore, Japanese Patent Laying-Open No. 10-084162 discloses a method of manufacturing a semiconductor laser device including a step of removing an impurity at a resonator end surface. In Japanese Patent Laying-Open No. 10-084162, first, as shown in FIGS. 25, 26, a semiconductor wafer 530 having crystal growth and electrode formation is cleaved, resulting in a laser bar 532 having a resonator end surface 531. Then, as shown in FIG. 27, the above-noted laser bar 532 is put into a vacuum container 534 with a plasma generation apparatus 533, and resonator end surface 531 exposed by the cleavage is irradiated with Ar plasma 535. Thereafter, a reflection film is formed on the resonator end surface in vacuum container 534. As a result, moisture attached on resonator end surface 531 is removed, so that defects at the end surface resulting from moisture can be reduced. It is therefore thought that a semiconductor laser device capable of high power operation with improved COD level can be obtained.

However, in the method of manufacturing a semiconductor laser device as disclosed in Japanese Patent Laying-Open No. 10-209562, since cleavage into a bar shape needs to be performed in ultrahigh vacuum, the manufacturing apparatus is inevitably complicated and in addition, the yield is reduced. On the other hand, in the method of manufacturing a semiconductor laser device as disclosed in Japanese Patent Laying-Open No. 10-084162, moisture on the resonator end surface obtained by the cleavage can be removed. However, the semiconductor crystal is damaged by plasma radiation at the resonator end surface, and the interface state resulting from the damage is produced. Therefore, the improvement of COD level by reducing defects at the resonator end surface is not necessarily achieved, and a stable high power operation is not necessarily achieved.

SUMMARY OF THE INVENTION

The present invention is made to solve the aforementioned problems. An object of the present invention is to provide a semiconductor laser device capable of stable operation at the time of high power output and a method of manufacturing a semiconductor laser device for obtaining the semiconductor laser device with a simple procedure, as well as an optical transmission module and an optical disk apparatus using the semiconductor laser device.

The present invention relates to a method of manufacturing a semiconductor laser device at least including a semiconductor laser element having a resonator end surface for emitting laser light and a reflectance control film. The method includes: a laser wafer formation step of forming a laser wafer at least having a semiconductor layer to form a resonator end surface; a cleavage step of cleaving the laser wafer in atmosphere and forming a semiconductor laser element having the resonator end surface; a contact step of bringing the resonator end surface in contact with a nitrogen containing gas containing 90-100 volume % nitrogen for at least one hour; and a reflectance control film formation step of forming a reflectance control film in contact with the resonator end surface.

In the present invention, preferably, in the reflectance control film formation step, the reflectance control film is formed in a state where the resonator end surface is heated.

In the present invention, preferably, the heating is performed with a temperature of the resonator end surface set within a range of 200-300° C.

The present invention also relates to a semiconductor laser device obtained by the manufacturing method as described above. A nitrogen atom is present at an interface between the resonator end surface and the reflectance control film.

In the semiconductor laser device according to the present invention, a material forming a laser light emitting region at the resonator end surface may at least include Ga.

The present invention also relates to an optical transmission module and an optical disk apparatus using the semiconductor laser device as described above.

In accordance with the present invention, the interface states produced by formation of an impurity layer such as an oxide film on a resonator end surface due to the effect of moisture, oxygen and the like can be reduced easily. Therefore, light absorption at the interface state and COD degradation can be restrained, and a semiconductor laser device capable of stable operation at the time of high power output can thus be obtained. In addition, using the semiconductor laser device, an optical transmission module and an optical disk apparatus having high reliability in a high power operation can be obtained.

The semiconductor laser device in the present invention is characterized by being capable of stable operation at the time of high power output without damage to a resonator end surface and is preferably applicable to a variety of optical disk apparatuses and optical transmission modules of optical communication apparatuses.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the present invention, a method of manufacturing a semiconductor laser device at least having a semiconductor laser element provided with a resonator end surface for emitting laser light and a reflectance control film includes a laser wafer formation step of forming a laser wafer at least having a semiconductor layer to form the resonator end surface, a cleavage step of forming a resonator end surface in the laser wafer, a contact step of bringing the resonator end surface into contact with a nitrogen containing gas containing 90-100 volume % nitrogen for one hour or longer, and a reflectance control film formation step of forming a reflectance control film in contact with the resonator end surface.

The resonator end surface can be obtained with a simple method by forming the resonator end surface by cleavage in the atmosphere, as compared with such a conventional method, for example, as cleavage in ultrahigh vacuum. Although an impurity layer such as an oxide film formed of an adhering matter such as moisture or oxygen is produced at the resonator end surface obtained by cleavage in the atmosphere, in the present invention, a contact step is performed to additionally bring the resonator end surface into nitrogen containing gas, so that the adhering matter is substituted with nitrogen and then removed. Therefore, in the present invention, the interface states of the impurity layer at the resonator end surface due to the effect of moisture or oxygen can be reduced easily, and light absorption by the interface state and COD degradation are restrained. Thus, a semiconductor laser device capable of stable operation at the time of high power output can be obtained.

Furthermore, the step of bringing the resonator surface in contact with nitrogen containing gas eliminates a plasma process or the like on the resonator end surface. Accordingly, a semiconductor laser device having high reliability in a high power operation can be obtained without damaging crystals of the semiconductor layers forming the resonator end surface. In addition, the simplified manufacturing procedure effectively reduces the costs.

In the following, typical embodiments of the present invention will be described with reference to the figures. It is noted that in the following embodiments, a first conductivity type is an n type (simply referred to as "n-" hereinafter) and a second conductivity type is a p type (simply referred to as "p-" hereinafter), by way of example. However, the present invention is not limited thereto.

First Embodiment

Figure 1:
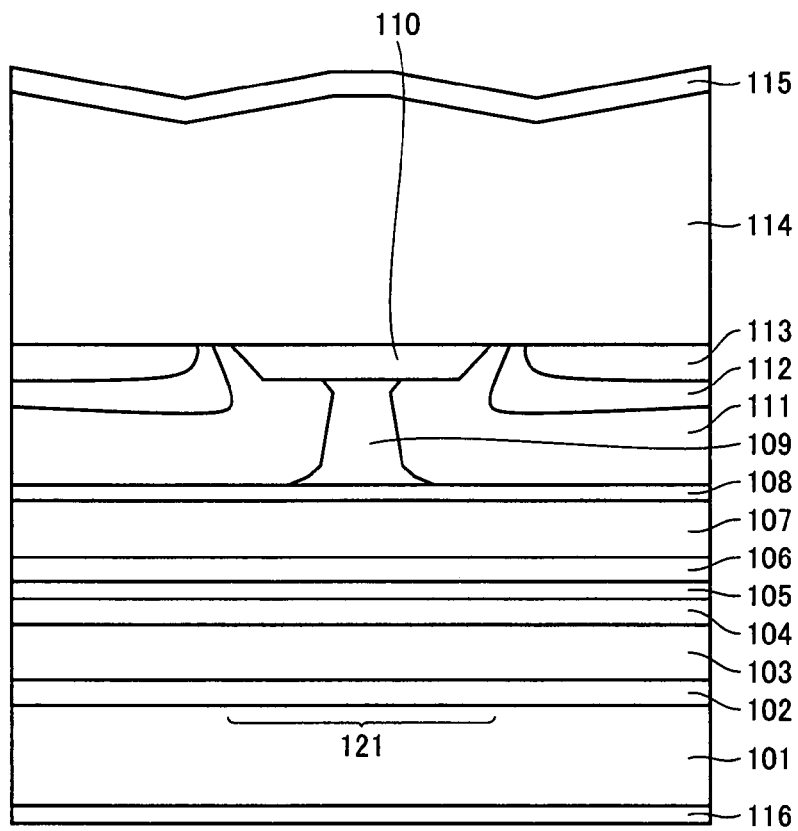
FIG. 1 is a schematic cross-sectional view of a semiconductor laser element formed in a first embodiment of the present invention.

FIG. 1 shows a cross section vertical to a stripe direction.

In a semiconductor laser element in accordance with the present embodiment, a semiconductor layer formed by stacking an n-type semiconductor layer, an active layer and a p-type semiconductor layer on a substrate is provided with a p-side electrode and an n-side electrode. Specifically, for example, a buffer layer 102 made of n-GaAs, a first lower cladding layer 103 made of n-$Al_{0.5}Ga_{0.5}As$, a lower guide layer 104 made of n-$Al_{0.4}Ga_{0.6}As$, an active layer 105 having a multiple strained quantum well structure, an upper guide layer 106 made of p-$Al_{0.4}Ga_{0.6}As$, a first upper cladding layer 107 made of p-$Al_{0.5}Ga_{0.5}As$, an etching stop layer 108 made of p-GaAs, a second upper cladding layer 109 made of p-$Al_{0.5}Ga_{0.5}As$, and a cap layer 110 made of p-GaAs are successively stacked on a substrate 101 made of n-GaAs. Second upper cladding layer 109 made of p-$Al_{0.5}Ga_{0.5}As$ and cap layer 110 made of p-GaAs are processed in a ridge-shaped mesa-stripe portion 121.

On opposite sides of mesa-stripe portion 121, for example, a first current block layer 111 made of n-$Al_{0.7}Ga_{0.3}As$, a second current block layer 112 made of n-GaAs and a planarization layer 113 made of p-GaAs are formed. For example, a contact layer 114 made of p-GaAs is formed on the aforementioned mesa-stripe portion 121 and the aforementioned planarization layer 113 made of p-GaAs.

A p-side electrode 115 is formed on the aforementioned contact layer 114. An n-side electrode 116 is formed on the back surface of the aforementioned substrate 101, namely, the surface on which the aforementioned semiconductor layers are not stacked.

Two resonator end surfaces 132, 133 are formed by cleavage. Reflectance control films of a low reflection film 135 and a high reflection film 136 are formed on the semiconductor layers at the respective resonator end surfaces.

The effect of the present invention shows up significantly in particular in the case where active layer 105 as a laser light emitting region at the resonator end surface at least includes Ga. In the case where an active layer including Ga is formed, an interface state is likely to be formed at the resonator end surface. However, formation of the interface state in Ga can be restrained by substituting moisture or oxygen adhering to the resonator end surface after cleavage with nitrogen, so that light absorption by the interface state and COD degradation can be restrained and thus a semiconductor laser device capable of stable operation at the time of high power output can be obtained.

In the following, referring to FIG. 2-FIG. 8, a method of manufacturing a semiconductor laser device in the present embodiment will be described.

<Laser Wafer Formation Step>

Figure 2:
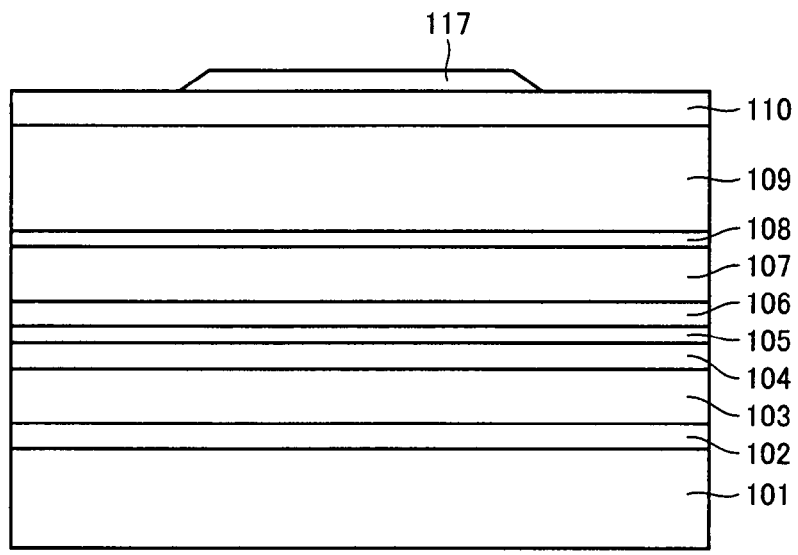
FIGS. 2-8 illustrate a method of manufacturing a semiconductor laser device in the first embodiment of the present invention.

First, as shown in FIG. 2, for example, buffer layer 102 made of n-GaAs (layer thickness: about 0.5 μm), first lower cladding layer 103 made of n-$Al_{0.5}Ga_{0.5}As$ (layer thickness: about 1.8 μm), lower guide layer 104 made of n-$Al_{0.4}Ga_{0.6}As$ (layer thickness: about 0.1 μm), active layer 105 having a multiple quantum well structure, upper guide layer 106 made of p-$Al_{0.4}Ga_{0.6}As$ (layer thickness: about 0.1 μm), first upper cladding layer 107 made of p-$Al_{0.5}Ga_{0.5}As$ (layer thickness: about 0.15 μm), etching stop layer 108 made of p-GaAs (layer thickness: about 4 nm), second upper cladding layer 109 made of p-$Al_{0.5}Ga_{0.5}As$ (layer thickness: about 1.28 μm), and cap layer 110 made of p-GaAs (layer thickness: about 0.75 μm) are successively crystal-grown on substrate 101 made of n-GaAs having (100) plane by MOCVD method.

Active layer 105 in the present embodiment may have a multiple quantum well structure having, for example, alternately stacked two $In_{0.065}Ga_{0.935}As$ quantum well layers (each having a layer thickness of about 4.6 nm) and three $Al_{0.15}Ga_{0.85}As$ barrier layers (each having a layer thickness of about 21.5 nm, 7.9 nm, 21.5 nm from the substrate). However, the present invention is not limited thereto. Typically, active layer 105 may at least include Ga.

Next, a resist mask 117 (mask width: about 6 μm) is fabricated by a photolithography step at a part where a mesa-stripe portion is to be formed, such that a stripe direction has (01-1) direction.

Figure 3:
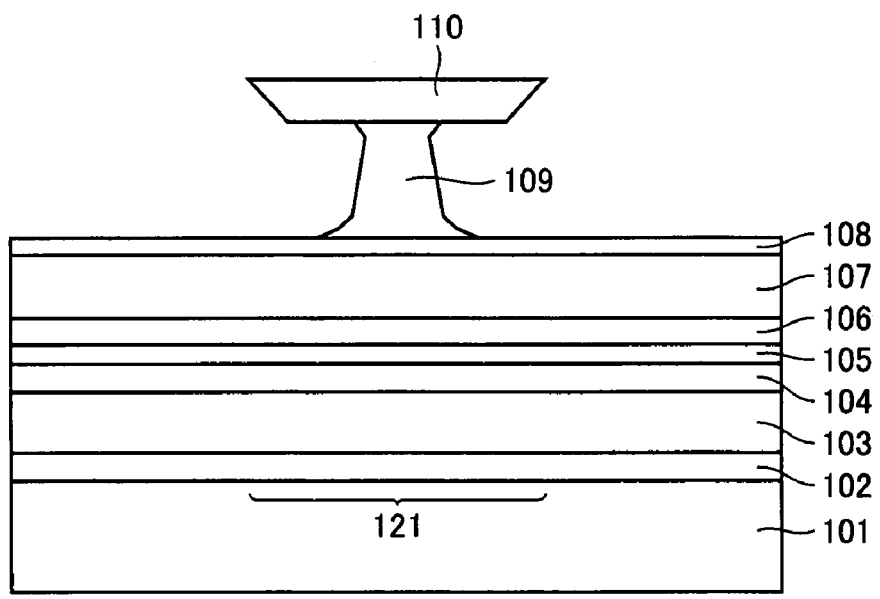

Then, as shown in FIG. 3, using the above-noted resist mask 117, cap layer 110 and second upper cladding layer 109 are partially etched to form mesa-stripe portion 121. The etching can be performed in two steps of an etching liquid including a mixture of sulfuric acid and hydrogen peroxide solution and hydrofluoric acid. Here, in the etching liquid including a mixture of sulfuric acid and hydrogen peroxide solution, if the volumetric ratio of sulfuric acid is too high, the etching rate is excessively increased and the etching control tends to be difficult. On the other hand, if the volumetric ratio of hydrogen peroxide solution is too high, the non-selectivity of a layer, for example, made of GaAs or AlGaAs for etching tends to be reduced. Thus, the volumetric ratio between sulfuric acid and hydrogen peroxide solution in the etching liquid is preferably selected as appropriate according to the desired etching rate. Here, a mixed aqueous solution of hydrochloric acid, hydrogen peroxide solution and water may be used as an etching liquid to achieve the similar effect. However, the etching liquid using sulfuric acid is superior in the etching controllability and is thus preferable.

The etching for forming mesa-stripe portion 121 is performed in two steps using, for example, an etching liquid including a mixture of sulfuric acid and hydrogen peroxide solution (the volumetric mixture ratio is sulfuric acid:hydrogen peroxide solution:water=1:8:50, the liquid temperature is 10° C.) and hydrofluoric acid (the liquid temperature is 10° C.). The etching is performed until immediately above an etching stop layer 108. Since the etching rate by hydrofluoric acid in GaAs is very slow, planarization of the etching surface and the width control of the mesa-stripe are possible. In addition, the total etching time of the two-steps as described above may be, for example, 240 seconds. In this case, the etching depth of cap layer 110 and second upper cladding layer 109 in the present embodiment as illustrated above may be 2.03 μm and the width of the lowermost portion of mesa-stripe portion 121 may be about 3.0 μm. After the etching, the aforementioned resist mask 117 is removed.

Figure 4:
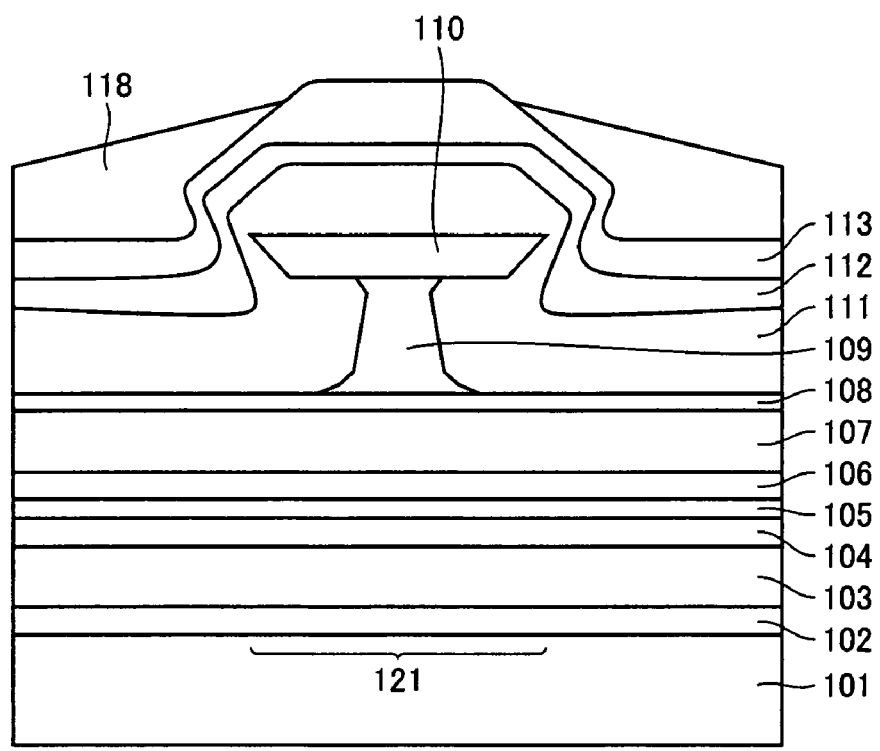

Thereafter, as shown in FIG. 4, for example, first current block layer 111 made of n-$Al_{0.7}Ga_{0.3}As$ (layer thickness: about 1.0 μm), second current block layer 112 made of n-GaAs (layer thickness: about 0.3 μm) and planarization layer 113 made of p-GaAs (layer thickness: about 0.65 μm) are successively formed by organic-metal crystal growth to form a light/current constricting region. Thereafter, a resist mask 118 is formed only on opposite sides of the aforementioned mesa-stripe portion 121 by a photolithography step.

Thereafter, the aforementioned planarization layer 113, the aforementioned second current block layer 112, the aforementioned first current block layer 111 and the aforementioned cap layer 110 on the aforementioned mesa-stripe portion 121 are partially removed by etching. This etching is performed in two steps using a mixed aqueous solution of ammonia and hydrogen peroxide solution and a mixed aqueous solution of sulfuric acid and hydrogen peroxide solution.

Then, the aforementioned resist mask 118 is removed, and contact layer 114 made of p-GaAs (layer thickness: about 4.0 μm) is formed by organic-metal crystal growth. Thereafter, p-side electrode 115 is formed on the aforementioned contact layer 114 by successively stacking, for example, Ti (layer thickness: about 150 nm)/Pt (layer thickness: about 50 nm)/Au (layer thickness: about 300 nm) using an electron beam evaporation method.

On the other hand, the back surface of the aforementioned substrate 101 (namely, that surface on which each of the semiconductor layers is not stacked) is etched to reduce the thickness from substrate 101 to p-side electrode 115 to about 100 μm. Then, n-side electrode 116 is formed on the entire back surface by successively stacking, for example, AuGe (layer thickness: about 150 nm)/Ni (layer thickness: about 15 nm)/Au (layer thickness: about 300 nm), using a resistance heating evaporation method. Then, an alloying process for the electrode material is performed by performing a thermal process at 390° C. for one minute. Thus, a laser wafer having a cross-sectional structure shown in the schematic cross-sectional view in FIG. 1 is formed. Thereafter, a cleavage step, a coating step and a division step are performed, resulting in a semiconductor laser element in a chip state.

<Cleavage Step>

Figure 5:
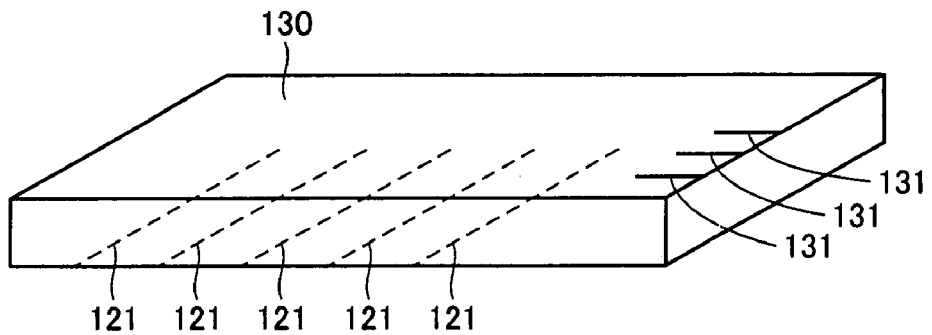

As shown in FIG. 5, in order to cleave a laser wafer 130 having a cross-sectional structure shown in FIG. 1 in a surface vertical to the direction in which mesa-stripe portion 121 extends, scribe lines 131 are drawn vertically to the direction in which the aforementioned mesa-stripe portion 121 extends, at the end portion of the aforementioned laser wafer 130. In the present embodiment, as shown in FIG. 5, the aforementioned scribe lines 131 are drawn on the back surface side of the aforementioned laser wafer 130.

Figure 6:
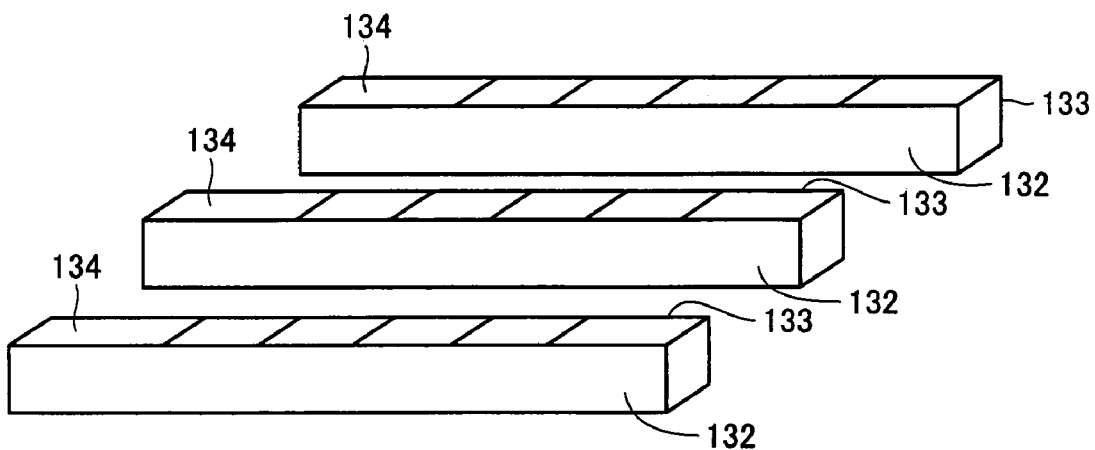

Then, starting from the aforementioned scribe line 131, laser wafer 130 is cleaved in the direction in which scribe line 131 extends. Scribe lines 131 may be drawn with spacing of a desired resonator length in the semiconductor laser device, which is 500 μm in the present embodiment. In this way, as shown in FIG. 6, a laser bar 134 with a width of a resonator length, having two resonator end surfaces 132 and 133, is fabricated as a semiconductor laser element. The cleavage is performed in the atmosphere. The pressure of the atmosphere is preferably the normal atmospheric pressure in view of manufacturing costs. However, cleavage may be performed, for example, in a reduced pressure state. Furthermore, although the temperature of the atmosphere in contact with the resonator end surface during cleavage is not particularly limited, it may be set, for example, at room temperature, which is advantageous in manufacturing costs.

<Contact Step>

Next, the aforementioned laser bar 134 after the cleavage is left standing in a nitrogen containing gas containing nitrogen within the range of 90-100 volume % so that the resonator end surface is brought into contact with the nitrogen containing gas. Accordingly, moisture or oxygen in the atmosphere which adheres to the surface of the semiconductor layer forming the resonator end surface exposed by the cleavage can be substituted with nitrogen in the nitrogen containing gas, so that the surface of the semiconductor layer is covered with nitrogen.

Because of inclusion of 90 volume % or more nitrogen in the nitrogen containing gas, the adhering matter to the resonator end surface can be substituted with nitrogen sufficiently in the contact step in the present invention, and the interface states at the resonator end surface can be reduced to a desired degree. The nitrogen containing gas preferably contains nitrogen at a high ratio, and more preferably contains 95 volume % or more nitrogen and still more preferably 99 volume % or more nitrogen. Most preferably, the nitrogen containing gas is made of only nitrogen. The other components that may be included in the nitrogen containing gas includes a component which may be contained in the atmosphere, such as oxygen, argon, carbon dioxide, neon, helium, or methane.

In the present invention, the contact time with the nitrogen containing gas is set to one hour or longer. If the contact time is shorter than one hour, moisture or oxygen is not substituted with nitrogen enough and therefore the effect of reducing the interface states of the impurity layer at the resonator end surface may be insufficient. More preferably, the contact time is set to four hours or longer. In this case, moisture or oxygen is well substituted with nitrogen. The contact time set, for example, to 40 hours or shorter or 20 hours or shorter is preferable in terms of manufacturing efficiency. The most typical contact time may be 15 hours. As the time of the contact step becomes longer, the process wastes time, which is industrially not preferable, although the effect of substitution with nitrogen is good. For example, even if the amount of laser bars exceeds the processing capacity of a reflectance control film forming apparatus used in the reflectance control film formation step as described later or if the process is delayed due to some trouble of the apparatus, a laser bar which has not yet been supplied to the reflectance control film formation step can be stored in the nitrogen containing gas, so that the manufacturing margin is increased without wasting the process or the semiconductor laser devices. Therefore, the effect of the present invention is not diminished even if the time of the contact step is set longer.

The nitrogen containing gas may have the temperature set to room temperature or may be heated, for example, within the range of room temperature to 150° C. The nitrogen containing gas may have the pressure set to normal atmospheric pressure or may be pressurized, for example, at normal atmospheric pressure to 1 Mpa.

<Reflectance Control Film Formation Step>

Next, low reflection film 135 and high reflection film 136 are formed as reflectance control films on the two resonator end surfaces 132, 133 of the aforementioned laser bar, respectively, using an electron beam evaporation method. In the following, an operation of forming a reflectance control film will also be simply referred to as coating.

The reflectance control film is particularly preferably formed in a state where the resonator end surface is heated. In this case, good adhesiveness between the semiconductor layer at the resonator end surface and the reflectance control film can be ensured and in addition, a reflectance control film having a denser film structure can be formed. Furthermore, as a reflectance control film is formed in a state where the resonator end surface is heated, a reflectance control film having a dense and stable structure can be formed with good adhesiveness, even if moisture or oxygen adhering to the resonator end surface is not completely substituted with nitrogen and left. Therefore, in accordance with the present invention, COD degradation resulting from a reflectance control film having an unstable film structure can be prevented, and a semiconductor laser device which is capable of stable operation at the time of high power output and is superior in element characteristics and reliability can be obtained.

In particular, the aforementioned heating is preferably performed with the temperature of the resonator end surface set within the range of 200-300° C. If the temperature of the resonator end surface is set to 200° C. or higher, substitution of the impurity layer at the resonator end surface with nitrogen proceeds efficiently. If the temperature is set to 300° C. or lower, the deteriorated element characteristics and reliability due to detachment or rearrangement of an element from the semiconductor layer at the resonator end surface can be prevented. Here, the heating time in the reflectance control film formation step is not particularly limited as long as it is set as appropriate in the range in which a reflectance control film having a desired thickness is obtained.

Figure 7:
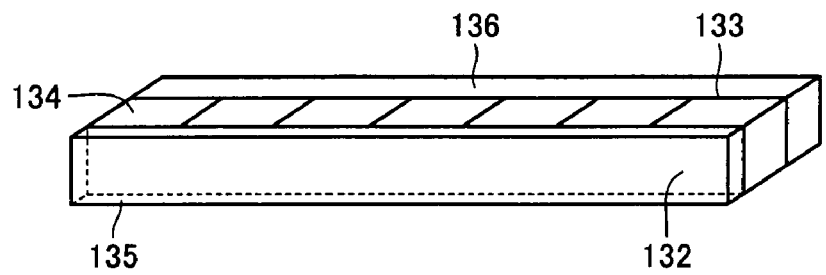
Figure 8:
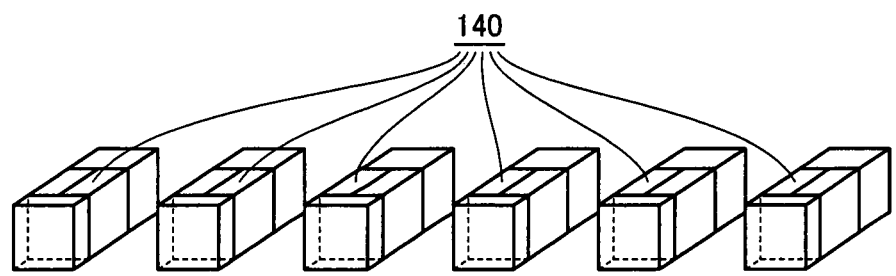
Figure 9:
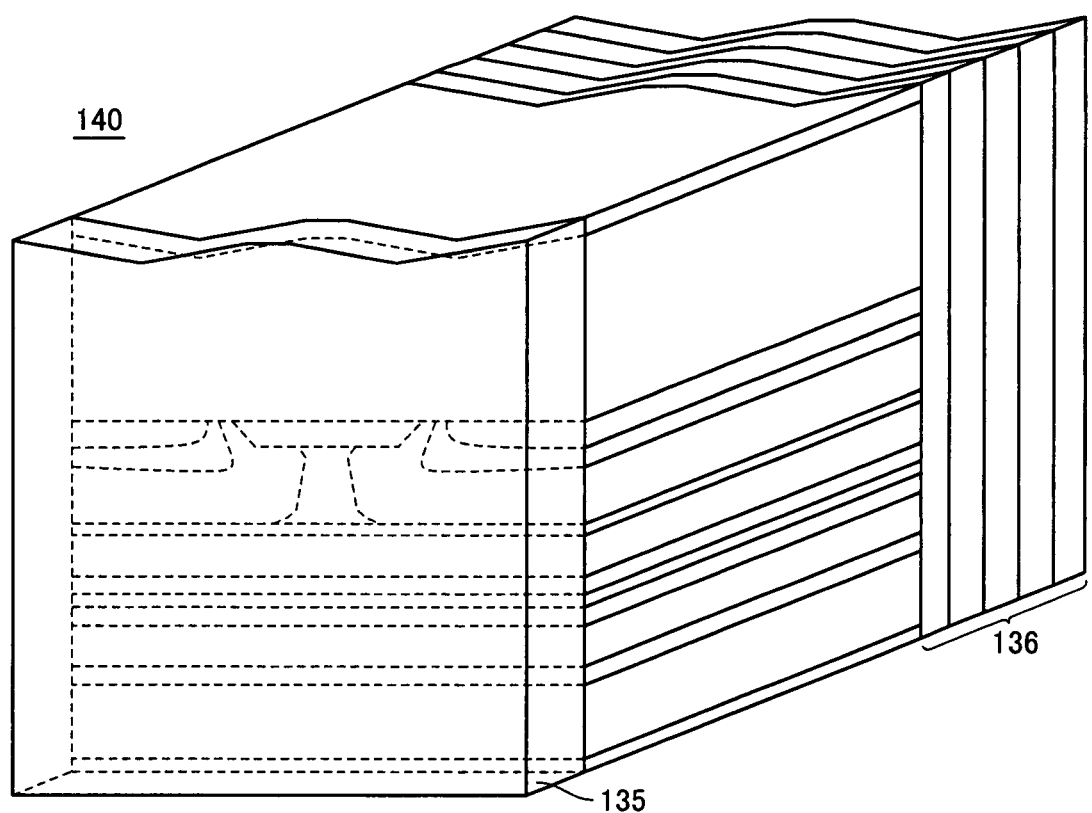
FIG. 9 is a schematic perspective view of the semiconductor laser device formed in the first embodiment of the present invention.

Most typically, when a reflectance control film is formed by deposition by an electron beam evaporation method, the aforementioned laser bar 134 can be heated, for example, up to 250° C. As shown in FIG. 7, for example, one $Al_2O_3$ layer (layer thickness: about 136.5 nm) is formed as low reflection film 135, and, for example, three $Al_2O_3$ layers (layer thickness: about 128 nm/128 nm/225 nm in order from the semiconductor layer forming the resonator end surface) and, for example, two Si layers (layer thickness: about 50 nm/50 nm) are alternately stacked as high reflection film 136. Then, as shown in FIG. 8, the aforementioned laser bar is divided for each stripe and cut off, resulting in a semiconductor laser device 140 in a chip state as shown in FIG. 9.

In the semiconductor laser device according to the present invention obtained by the aforementioned manufacturing method, a nitrogen atom is preferably present at the interface between the resonator end surface and the reflectance control film. When moisture, oxygen or the like at the resonator end surface is well substituted with nitrogen, nitrogen atoms are usually left at the interface between the resonator end surface and the reflectance control film. The nitrogen atoms present at the interface between the resonator end surface and the reflectance control film can be detected, for example, by SIMS (Secondary Ion Mass Spectrometer) or the like.

Although in the first embodiment as described above, the oscillation wavelength of the semiconductor laser device is set to 890 nm and may be in the 890 nm band, the oscillation wavelength of the semiconductor laser device is not limited in the present invention and may be set in any other wavelength band, for example, 780 nm band, 650 nm band, 1.3 μm band, 1.55 μm band or the like by changing a composition of a semiconductor layer such as an active layer.

Second Embodiment

Figure 10:
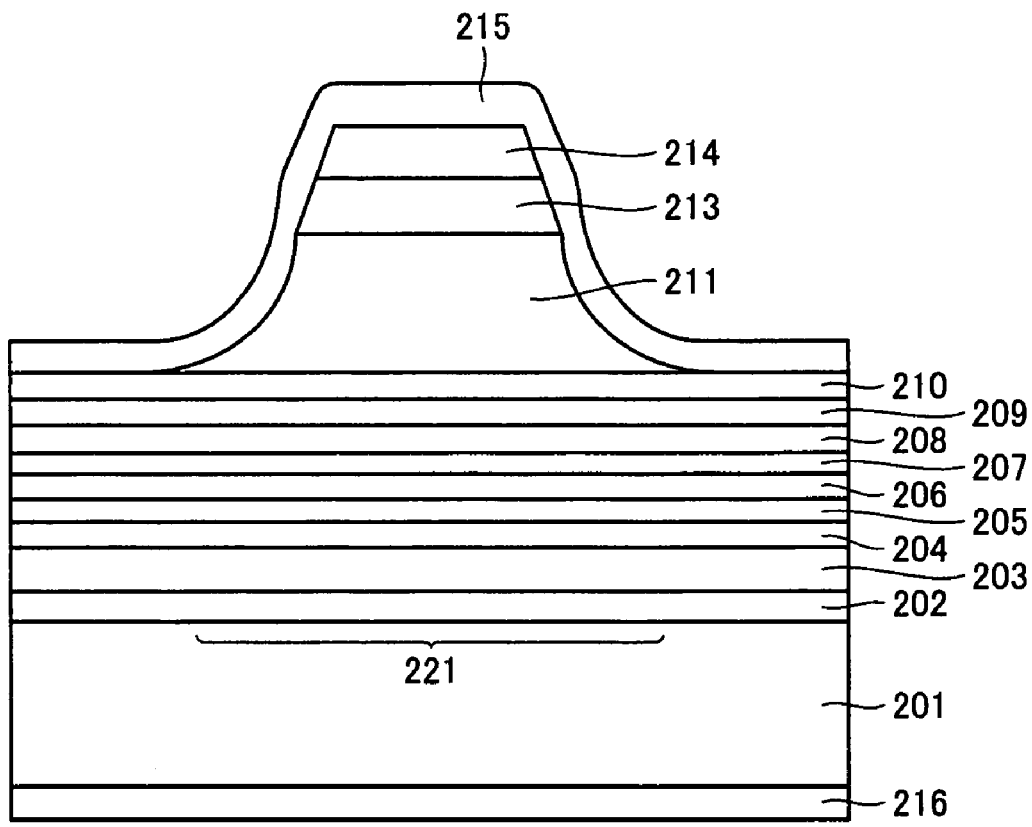
FIG. 10 is a schematic cross-sectional view of a semiconductor laser device formed in a second embodiment of the present invention.

FIG. 10 shows a cross section vertical to a stripe direction.

A semiconductor laser device in accordance with the present embodiment includes, for example, a buffer layer 202 made of n-GaAs, a first lower cladding layer 203 made of n-$Al_{0.5}Ga_{0.5}As$, a second lower cladding layer 204 made of n-$Al_{0.422}Ga_{0.578}As$, a lower guide layer 205 made of $Al_{0.25}Ga_{0.75}As$, an active layer 206 having a multiple strained quantum well structure, an upper guide layer 207 made of $Al_{0.4}Ga_{0.6}As$, a first upper cladding layer lower layer 208 made of p-$Al_{0.558}Ga_{0.442}As$, a first upper cladding layer upper layer 209 made of p-$Al_{0.558}Ga_{0.442}As$, and an etching stop layer 210 made of p-$In_{0.34}Ga_{0.66}As_{0.3}P_{0.7}$, on a substrate 201 made of n-GaAs.

A mesa-stripe portion 221 shaped like a ridge is formed on the aforementioned etching stop layer 210. Mesa-stripe portion 221 is comprised of a second upper cladding layer 211 made of p-$Al_{0.5}Ga_{0.5}As$, a first contact layer 213 made of p-GaAs and a second contact layer 214 made of $p^{++}$-GaAs.

A p-side electrode 215 is formed on the above-noted mesa-stripe portion 221 and etching stop layer 210. On the other hand, an n-side electrode 216 is formed on the back surface of the above-noted substrate 201 made of n-GaAs.

Two resonator end surfaces 232, 233 are obtained by cleavage. Reflectance control films comprised of a low reflection film 235 and a high reflection film 236 are formed on the semiconductor layers forming the respective resonator end surfaces.

In the following, referring to FIG. 11-FIG. 14, a method of manufacturing a semiconductor laser device in the present embodiment will be described.

<Laser Wafer Formation Step>

For example, buffer layer 202 made of n-GaAs (layer thickness: about 0.5 μm), first lower cladding layer 203 made of n-$Al_{0.5}Ga_{0.5}As$ (layer thickness: about 2 μm), second lower cladding 204 made of n-$Al_{0.422}Ga_{0.578}As$ (layer thickness: about 0.1 μm), lower guide layer 205 made of $Al_{0.25}Ga_{0.75}As$ (layer thickness: about 3 nm), active layer 206 having a multiple quantum well structure, upper guide layer 207 made of $Al_{0.4}Ga_{0.6}As$ (layer thickness: about 0.1 μm), first upper cladding layer lower layer 208 made of p-$Al_{0.558}Ga_{0.442}As$ (layer thickness: about 0.2 μm, doping concentration: about $1.35 \times 10^{18}$ cm$^{-3}$), first upper cladding layer upper layer 209 made of p-$Al_{0.558}Ga_{0.442}As$ (layer thickness: about 0.1 μm, doping concentration: about $10 \times 10^{17}$ cm$^{-3}$), etching stop layer 210 made of p-$In_{0.34}Ga_{0.66}As_{0.3}P_{0.7}$ (layer thickness: about 15 nm, doping concentration: about $10 \times 10^{17}$ cm$^{-3}$), a p-$Al_{0.5}Ga_{0.5}As$ layer (layer thickness: about 1.28 μm) for forming second upper cladding layer 211, a p-GaAs layer (layer thickness: about 0.2 μm, doping concentration: about $3.3 \times 10^{18}$ cm$^{-3}$) for forming first contact layer 213, and a $p^{++}$-GaAs layer (layer thickness: about 0.3 μm, doping concentration: about $10 \times 10^{20}$ cm$^{-3}$) for forming second contact layer 214 are successively crystal-grown on substrate 201 made of n-GaAs having (100) plane by MOCVD method.

The aforementioned active layer 206 is formed by, for example, alternately arranging an $In_{0.1001}Ga_{0.8999}As$ well layer and an $In_{0.238}Ga_{0.762}As_{0.5462}P_{0.4538}$ barrier layer. The above-noted well layer includes two layers, both of which each have a layer thickness of, for example, about 4.6 nm. On the other hand, the above-noted barrier layer includes three layers having respective layer thicknesses of about 21.5 nm, 7.9 nm, 21.5 nm from substrate 201.

Next, a resist mask (mask width: about 5 μm, not shown) is fabricated by a photolithography step at a part where the aforementioned mesa-stripe portion 221 is to be formed, such that a stripe direction has (01-1) direction.

Then, using the above-noted resist mask, the aforementioned second contact layer 214, first contact layer 213 and second upper cladding layer 211 are partially etched to form mesa-stripe portion 221 formed of second contact layer 214, first contact layer 213 and second upper cladding layer 211. The etching for forming this mesa-stripe portion 221 is performed, for example, with an etching liquid including a mixture of sulfuric acid and hydrogen peroxide solution (the volumetric mixture ratio is, for example, sulfuric acid:hydrogen peroxide solution:water=1:8:50, the liquid temperature is 10° C.).

The etching for forming the aforementioned mesa-stripe portion 221 is performed until immediately above etching stop layer 210.

In the method of manufacturing a semiconductor laser device in accordance with the present invention, in a case where an etching stop layer is formed, the etching stop layer is preferably formed, for example, of any one of InGaP, GaAsP, AlGaInP, AlGaInAsP and AlGaAsP. In the etching stop layer, the Group V composition ratio of P is preferably 0.6 or more. If the Group V composition ratio of P is 0.6 or more, the etching rate is extremely low and the etching does not proceed. Using this characteristic, the Group V composition ratio of P is set to 0.6 or more, so that etching of the semiconductor layer below the etching stop layer is prevented reliably. In addition, the width of the mesa-stripe portion can be fabricated accurately.

The thickness of the etching stop layer is preferably 10 nm or thicker. In this case, etching of the semiconductor layer below the etching stop layer is prevented more reliably.

In the present embodiment, since etching stop layer 210, for example, having a thickness of 15 nm made of $In_{0.34}Ga_{0.66}As_{0.3}P_{0.7}$ is formed, etching of the semiconductor layer below etching stop layer 210 is prevented reliably and, in addition, the width of the mesa-stripe portion can be fabricated accurately.

Because of formation of the aforementioned etching stop layer 210, the etching rate using a mixed aqueous solution of sulfuric acid and hydrogen peroxide solution in the present embodiment is as slow as 0.4 nm/sec, and etching toward the substrate hardly proceeds any more in the region where the aforementioned etching stop layer 210 is exposed. Therefore, after etching stop layer 210 is exposed, etching proceeds from the lateral direction with respect to mesa-stripe portion 221. In other words, the aforementioned etching stop layer 210 allows the width control of mesa-stripe portion 221 and planarization of the etching surface. The etching time can be set, for example, to 210 seconds. In this case, the total etching depth with the aforementioned etching liquid is 1.78 μm, the lowermost width of second upper cladding layer 211 made of p-$Al_{0.5}Ga_{0.5}As$ is about 3.3 μm, and the uppermost width of second contact layer 214 made of $p^{++}$-GaAs is about 0.8 μm.

In the present invention, prior to wet etching using the aforementioned etching liquid, first, dry etching may be performed to etch a side surface of mesa-stripe portion 221 approximately vertical to the substrate, and thereafter wet etching may be performed. In this case, in the wet etching, side etching is performed on the mesa-stripe portion formed by dry-etching. Here, since the adhesiveness at the interface between second contact layer 214 and the resist mask is not excessively high, the side surface of the mesa-stripe portion can be processed easily into a slightly forwardly tapered shape as shown in FIG. 10 rather than into an approximately vertically rising shape. Therefore, in a combination of dry etching and wet etching, as compared with only wet etching, the lowermost width of mesa-stripe portion 121 can be fabricated to be narrower with the width of second contact layer 214 kept. Accordingly, it becomes possible to fabricate a semiconductor laser device given flexibility by optical design.

After the aforementioned mesa-stripe portion 221 is formed in this manner, the aforementioned resist mask is removed, and then p-side electrode 215 formed of, for example, Ti (layer thickness: about 50 nm)/Pt (layer thickness: about 50 nm)/Au (layer thickness: about 300 nm) is formed on the entire surface. Accordingly, the aforementioned p-side electrode 215 covers the upper surface and side surface of mesa-stripe portion 221 and the exposed surface of etching stop layer 210. Here, current is injected into the aforementioned mesa-stripe portion 221 from the aforementioned p-side electrode 215 through the aforementioned second contact layer 214, and no current flows between the aforementioned etching stop layer 210 and the aforementioned p-side electrode 215 due to Schottky junction. In this way, current is selectively injected into the aforementioned mesa-stripe portion 221.

Next, the back surface of the aforementioned substrate 201 (namely, the surface on which each of the semiconductor layers is not formed) is etched to make the thickness from substrate 201 to p-side electrode 215 to about 100 μm. Then, n-side electrode 216 formed of, for example, AuGe (layer thickness: about 100 nm)/Ni (layer thickness: about 15 nm)/Au (layer thickness: about 300 nm) is provided on the entire back surface of substrate 201 and is subjected to a thermal process at 390° C. for one minute. A laser wafer is obtained by the method as described above. Thereafter, a cleavage step, a coating step and a division step are performed, resulting in a semiconductor laser device in a chip state.

<Cleavage Step>

Figure 11:
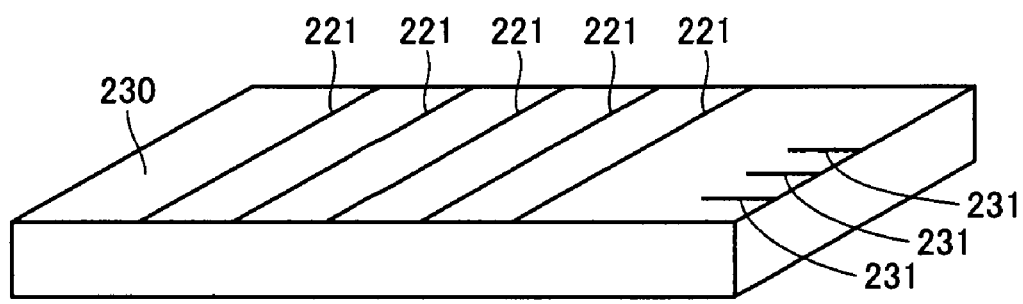
FIGS. 11-14 illustrate a method of manufacturing a semiconductor laser device in the second embodiment of the present invention.

As shown in FIG. 11, in order to cleave the resulting laser wafer 230 in a surface vertical to the direction in which mesa-stripe portion 221 extends, scribe lines 231 are drawn vertically to the direction in which the aforementioned mesa-stripe portion 221 extends, at the end portion of the aforementioned laser wafer 230. In the present embodiment, the aforementioned scribe lines 231 are drawn on the front surface of the aforementioned laser wafer 230.

Figure 12:
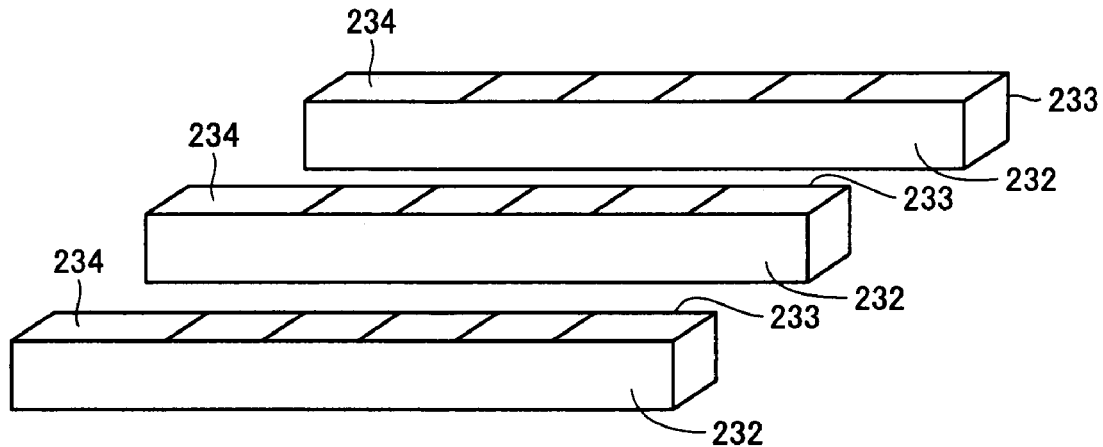

Then, starting from the aforementioned scribe line 231, laser wafer 230 is cleaved in the direction in which scribe line 231 extends. Scribe lines 231 are drawn with spacing of a desired resonator length in the semiconductor laser device of the present invention, which is 500 μm in the present embodiment. In this way, as shown in FIG. 12, a laser bar 234 with a width of a resonator length, having two resonator end surfaces 232 and 233, is fabricated as a semiconductor laser element. The cleavage is performed in the atmosphere. The temperature of the atmosphere in the cleavage may be set, for example, at room temperature.

<Contact Step>

Next, the aforementioned laser bar after the cleavage is left standing in a nitrogen containing gas containing 90-100 volume % nitrogen so that the resonator end surface is brought into contact with the nitrogen containing gas. Accordingly, moisture or oxygen in the atmosphere which adheres to the surface of the semiconductor layer forming the resonator end surface exposed by the cleavage can be substituted with nitrogen, so that the surface of the semiconductor layer can be covered with nitrogen. Although the time of the contact step is one hour or longer, the laser bar is left standing for 15 hours in the present embodiment.

<Reflectance Control Film Formation Step>

Figure 13:
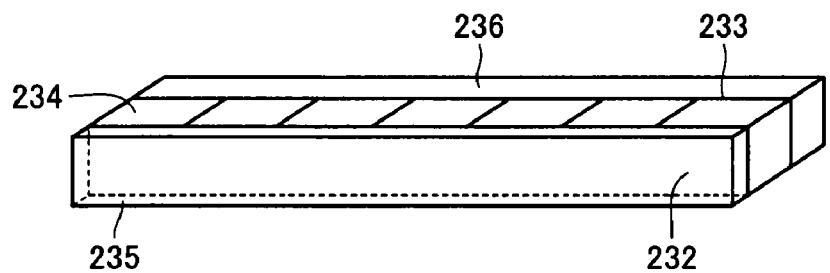
Figure 14:
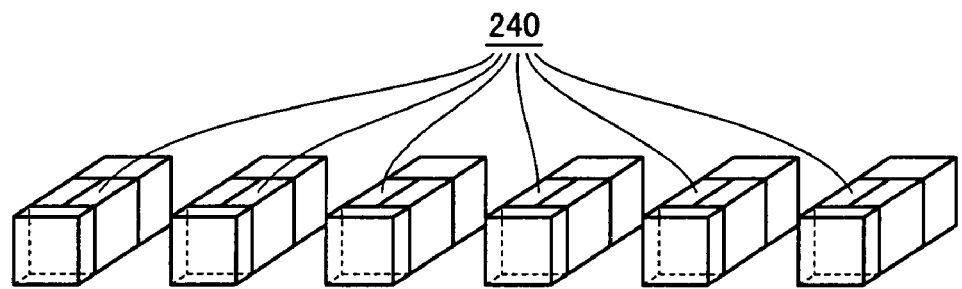
Figure 15:
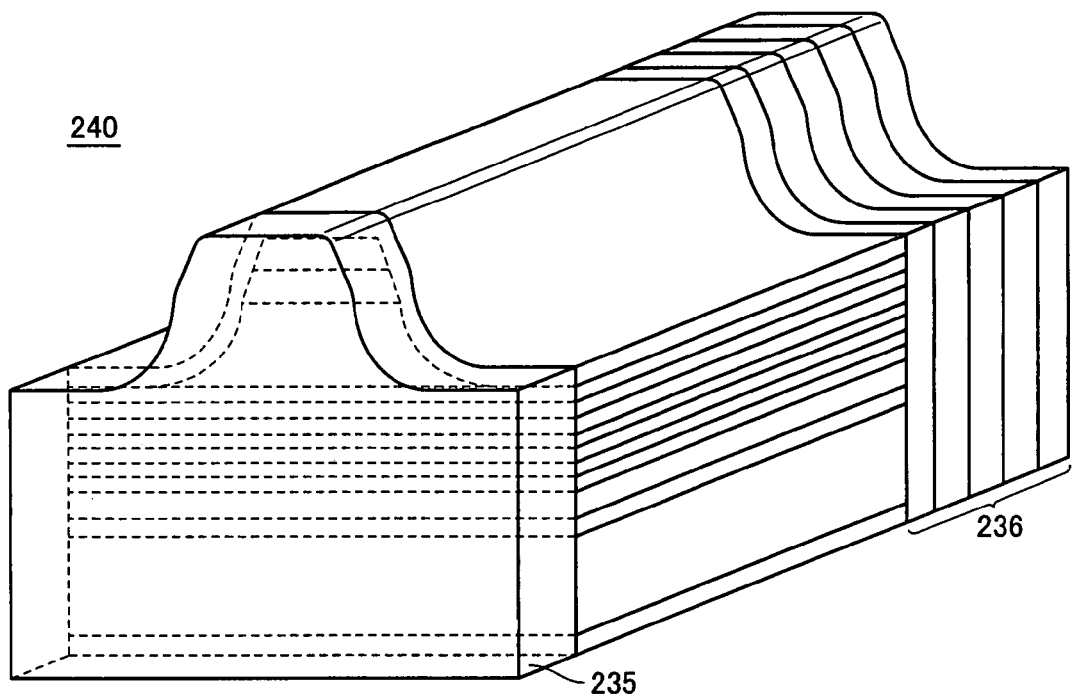
FIG. 15 is a schematic perspective view of the semiconductor laser device formed in the second embodiment of the present invention.

Thereafter, a low reflection film 235 and a high reflection film 236 are coated as reflectance control films on the two resonator end surfaces 232 and 233, respectively, of the aforementioned laser bar, using an electron beam evaporation method. In this deposition, the aforementioned laser bar 234 is heated, for example, to 200-300° C., typically up to 250° C. As shown in FIG. 13, for example, one $Al_2O_3$ layer (layer thickness: about 136.5 nm) is formed as low reflection film 235, and, for example, three $Al_2O_3$ layers (layer thickness: about 128 nm/128 nm/225 nm in order from the semiconductor layer) and, for example, two Si layers (layer thickness: about 50 nm/50 nm in order from the semiconductor layer) are alternately stacked as high reflection film 236. Then, as shown in FIG. 14, the aforementioned laser bar is divided for each stripe and cut off, resulting in a semiconductor laser device 240 in a chip state as shown in FIG. 15.

According to the method in the present embodiment, a laser wafer can be fabricated with single crystal-growth, and the manufacturing costs can be further reduced as compared with the semiconductor laser device in the first embodiment. Moreover, better element characteristics can be achieved.

In addition, according to the method in the present embodiment, the etching step of processing a semiconductor layer to form a mesa-stripe portion can be realized in a single step without changing an etching liquid, so that the manufacturing step is simplified thereby reducing the manufacturing costs. Moreover, the yield is considerably improved.

It is noted that, as for the operation other than the aforementioned operation in the present embodiment, a similar method as in the first embodiment may be employed.

Third Embodiment

Figure 16:
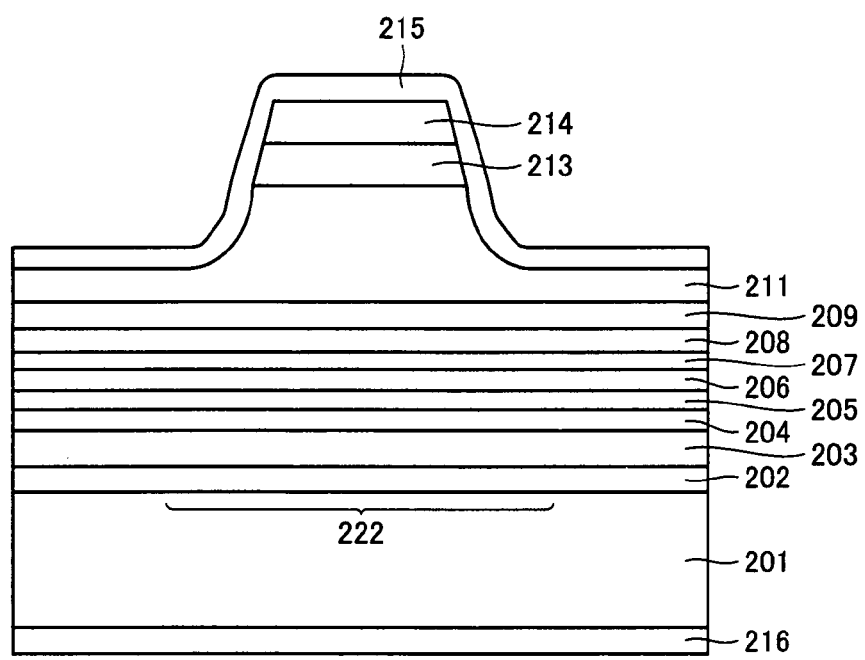
FIG. 16 is a schematic cross-sectional view of a semiconductor laser device formed in a third embodiment of the present invention.

In forming a semiconductor laser device in accordance with the present invention, a mesa-stripe portion may be formed without forming an etching stop layer but by stopping etching halfway in the second upper cladding layer, for example, by controlling the etching time. In the aforementioned first and second embodiments, formation of an etching stop layer has been described. In the present embodiment, a similar method as in the second embodiment as described above is employed until upper cladding layer upper layer 209 as shown in FIG. 16 is formed. Thereafter, without provision of an etching stop layer, second upper cladding layer 211, first contact layer 213, second contact layer 214, and a resist mask (not shown) are formed.

Thereafter, using the above-noted resist mask, etching is allowed to proceed through second contact layer 214, first contact layer 213 and halfway through second upper cladding layer 211, resulting in mesa-stripe portion 222 formed of second upper cladding layer 211, first contact layer 213, and second contact layer 214. Here, the processes other than the method of forming a mesa-stripe portion 222 can be performed similarly to the second embodiment.

In the semiconductor laser device obtained in the present embodiment, the etched second upper cladding layer 211 is exposed on the side portion of mesa-stripe portion 222, and a p-side electrode which is a thin film is arranged thereon. Using Schottky junction at the interface between the second upper cladding layer and the p-side electrode, current constriction for the mesa-stripe portion can be achieved. In the present embodiment, since an etching stop layer is not used, the structure of the semiconductor laser device can be further simplified and, in addition, the amount of consumed semiconductor materials can be further reduced.

It is noted that, as for the operation other than the aforementioned operation in the present embodiment, a similar method as in the second embodiment may be employed.

Fourth Embodiment

Figure 17:
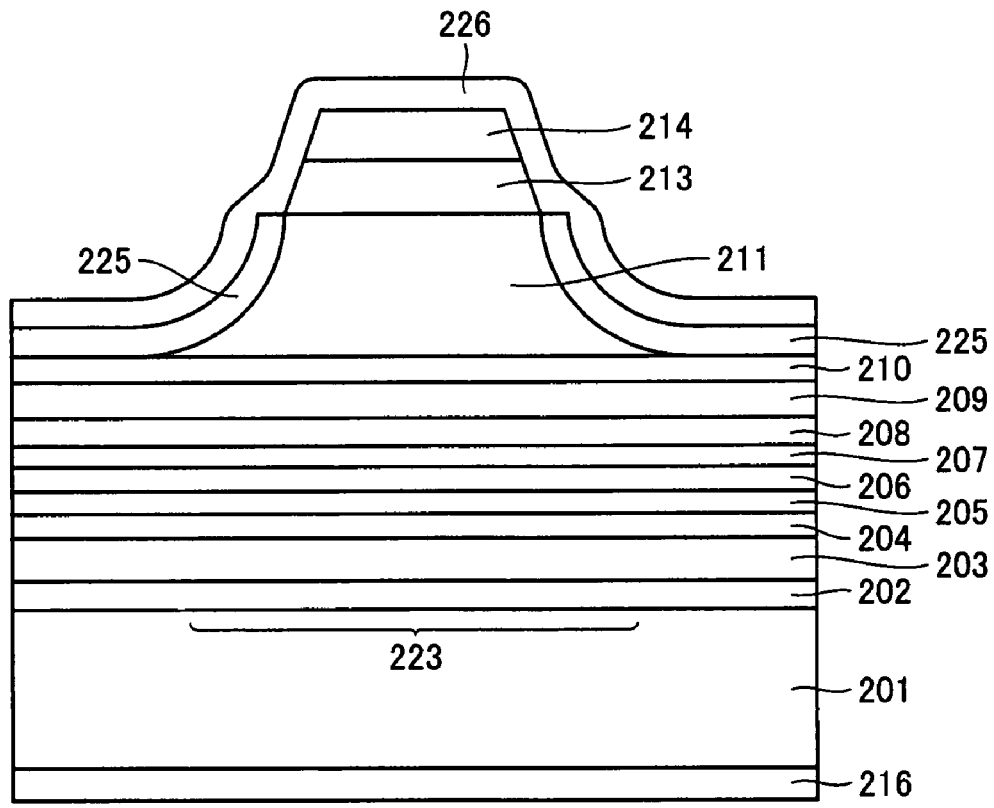
FIG. 17 is a schematic cross-sectional view of a semiconductor laser device formed in a fourth embodiment of the present invention.

In forming a semiconductor laser device in accordance with the present invention, for example, current constriction may be achieved, for example, using an air ridge structure formed of an insulating film such as silicon oxide ($SiO_2$) or silicon nitride ($SiN_x$), in place of using Shcottky junction with an etching stop layer and a p-side electrode, for example, as in the first and second embodiments. As shown in FIG. 17, a method similar to the second embodiment is employed until formation of etching stop layer 210. Then, after formation of second upper cladding layer 211, first contact layer 213, and second contact layer 214, the aforementioned second contact layer 214, first contact layer 213, second upper cladding layer 211 are partially etched using a resist mask, resulting in a mesa-stripe portion 223 formed of second upper cladding layer 211, first contact layer 213 and second contact layer 214. The etching is performed, for example, with an etching liquid of a mixture of sulfuric acid and hydrogen peroxide solution (the volumetric mixture ratio is, for example, sulfuric acid:hydrogen peroxide solution:water=1:8:50, the liquid temperature is 10° C.).

The etching for forming the aforementioned mesa-stripe portion 223 is performed, first, until immediately above etching stop layer 210. The etching time may be set, for example, to 210 seconds. In this case, the total etching depth is 1.78 μm, the lowermost width of second upper cladding layer 211 is about 3.3 μm, and the uppermost width of second contact layer 214 is about 0.8 μm.

After formation of the aforementioned mesa-stripe portion 223, the aforementioned resist mask is removed, an insulating layer 225, for example, formed of silicon oxide or silicon nitride is successively formed, and the insulating layer only on the aforementioned mesa-stripe portion 223 is removed. In addition, a p-side electrode 226 comprised of Ti (layer thickness: about 50 nm)/Pt (layer thickness: about 50 nm)/Au layer thickness: about 30 nm) is formed on the entire surface. Accordingly, the aforementioned p-side electrode covers the upper surface and side surface of the ridge stripe shape. In other words, in the present embodiment, current constriction (and light confinement) is achieved by an air ridge structure formed of insulating layer 225.

It is noted that, as for the operation other than the aforementioned operation in the present embodiment, a similar method as in the second embodiment may be employed.

Fifth Embodiment

In the present embodiment, a preferred mode of an optical transmission module using the semiconductor laser device in accordance with the present invention will be described. In use of an optical transmission module shown in FIG. 18, the same optical transmission module 300 is installed on each of the both parties of communication, for example, such as a terminal and a server, thereby constructing an optical transmission system to transmit and receive an optical signal between optical transmission modules 300 of the both parties.

Figure 18:
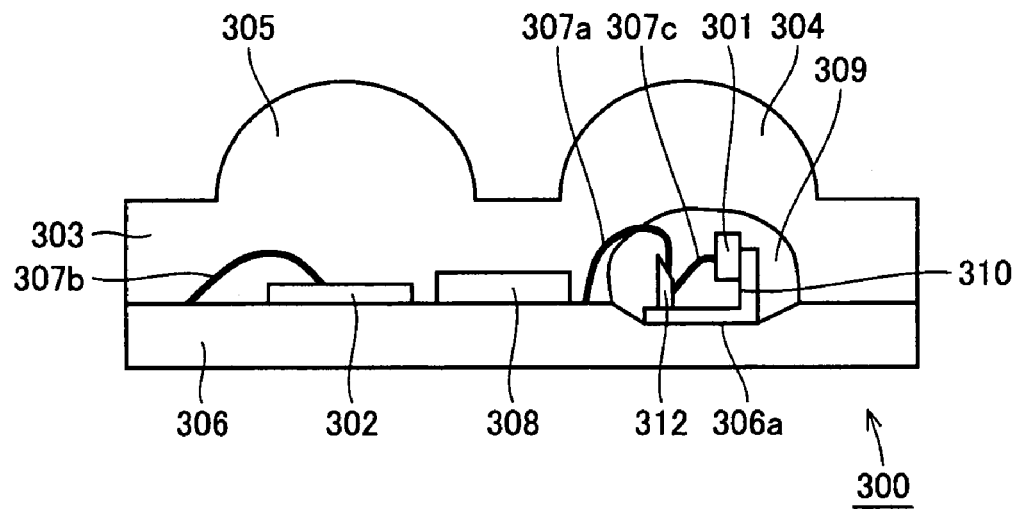
FIG. 18 is a schematic cross-sectional view showing an exemplary structure of an optical transmission module in accordance with the present invention.

Optical transmission module 300 includes, as shown in FIG. 18, a semiconductor laser device 301 in accordance with the present invention, as an example of a light source, and includes a light receiving element 302 which is, for example, a pin photodiode of Si (silicon). Semiconductor laser device 301 is mounted on circuit board 306. On a surface of this circuit board 306, patterns of both positive and negative electrodes for semiconductor laser drive and a depressed portion 306a for receiving semiconductor laser device 301 are formed. The depth of this depressed portion 306a is set, for example, to about 300 μm. A laser mount 310 as a mount material having semiconductor laser device 301 attached thereto is fixed by solder on the bottom surface of the aforementioned depressed portion 306a. The aforementioned depressed portion 306a has such a depth that does not hinder radiation of laser light by semiconductor laser device 301. Furthermore, the bottom surface of the aforementioned depressed portion 306a has roughness adjusted not to give adverse effect on the radiation angle of the aforementioned laser light.

The aforementioned light receiving element 302 is mounted on circuit board 306, and an electrical signal is taken out by a wire 307b.

On the aforementioned circuit board 306, an IC circuit 308 is mounted as an integrated circuit for laser drive and for reception signal processing.

Liquid silicone resin 309 including a filler for diffusing light is dropped by a proper amount in the aforementioned depressed portion 306a. Accordingly, the aforementioned silicone resin 309 stays in depressed portion 306a because of surface tension and covers and fixes laser mount 310 to depressed portion 306a. In the present embodiment, depressed portion 306a is formed in the surface of circuit board 306, and laser mount 310 is fixed to the bottom surface of depressed portion 306a. However, depressed portion 306a is not necessarily formed since silicone resin 309 stays on the surface of the laser chip and in the vicinity thereof because of surface tension, as described above.

The aforementioned silicone resin 309 can be heated, for example, to 80° C. for about five minutes and hardened to be in a gel state. Furthermore, the aforementioned silicone resin 309 is covered with a mold 303, for example, made of a transparent epoxy resin. In this mold 303, a lens portion 304 for radiation angle control of laser light and a lens portion 305 for collecting signal light are integrally formed as mold lenses. The aforementioned lens portion 304 is positioned above semiconductor laser device 301 while lens portion 305 is positioned above light receiving element 302.

Figure 19:
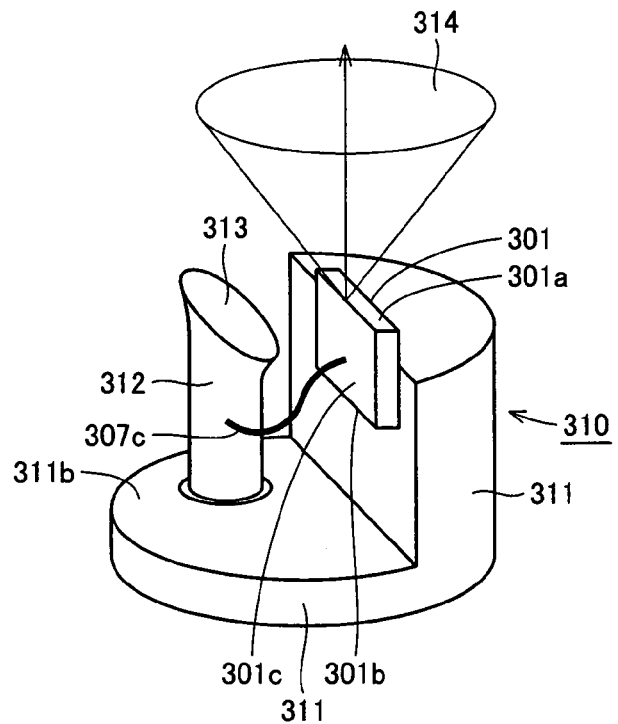
FIG. 19 is a schematic perspective view showing an exemplary structure of a part of a light source of the optical transmission module in accordance with the present invention.

As described above, in this optical transmission system, it is a prerequisite that the other party holds another same optical transmission module for transmitting and receiving an optical signal. Therefore, an optical signal carrying information from the aforementioned semiconductor laser device 301 is received by the light receiving element of the optical transmission module on the other party. On the other hand, an optical signal carrying information from the semiconductor laser device of the optical transmission module on the other party is received by light receiving element 302. In the following, the aforementioned laser mount 310 will be described with reference to FIG. 19.

The above-noted laser mount 310 has an L-shaped heat sink 311. Semiconductor laser device 301 is die-bonded to heat sink 311, using, for example, an In glue material. A high reflection film as a reflectance control film is coated on a bottom surface 301b of the aforementioned semiconductor laser device 301, while a low reflection film as a reflectance control film is coated on a top surface 301a of the semiconductor laser device. These reflectance control films also serve to protect the resonator end surface of the semiconductor laser device.

A positive electrode 312 is fixed to a base portion 311b of the above-noted heat sink 311. An insulator is inserted between this positive electrode 312 and base portion 311b to prevent conduction between positive electrode 312 and heat sink 311. The above-noted positive electrode 312 is connected, for example, by a wire 307c made of gold, to an electrode region 301c provided on the surface of semiconductor laser device 301.

The aforementioned laser mount 310 is fixedly soldered to a negative electrode portion (not shown) for laser drive on circuit board 306 shown in FIG. 18. A flat portion 313 of the aforementioned positive electrode 312 is electrically connected to a positive electrode portion (not shown) for laser drive on circuit board 306 through wire 307a. Formation of such wiring completes optical transmission module 300 capable of obtaining a laser beam 314 by oscillation.

Optical transmission module 300 having the configuration as described above in accordance with the present invention uses semiconductor laser device 301 in accordance with the present invention and therefore has high reliability in high power operation.

Sixth Embodiment

Figure 20:
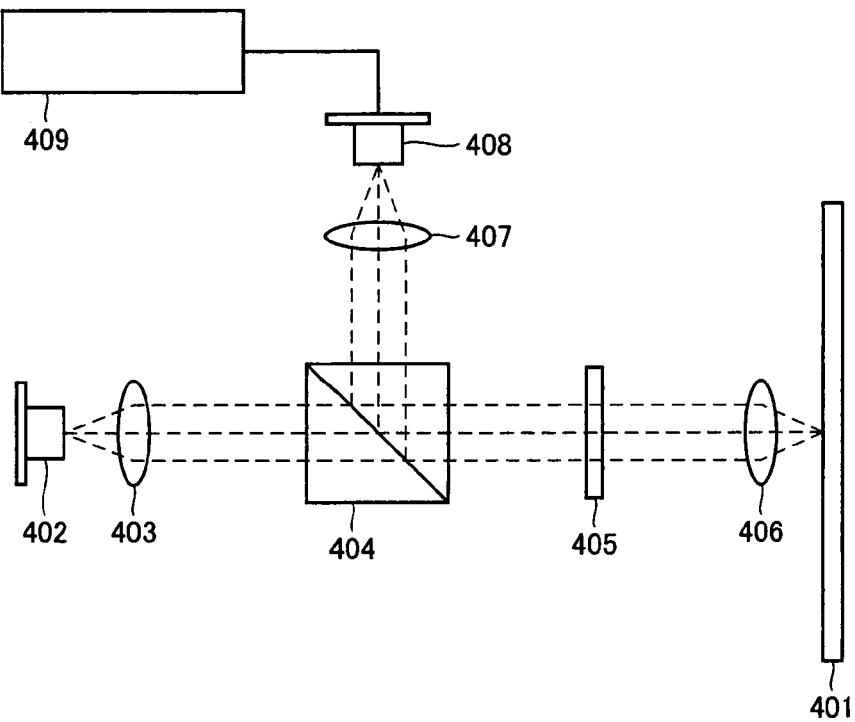
FIG. 20 is a schematic view showing an exemplary structure of an optical disk apparatus in accordance with the present invention.

An optical disk apparatus having a configuration shown in FIG. 20 includes a light emitting element for writing data into an optical disk 401 and reproducing data written in optical disk 401. This light emitting element is a semiconductor laser device 402 which allows for oscillation, for example, at 780 nm by designing a layer such as a quantum well active layer as appropriate. The typical steps for forming this semiconductor laser device 402 have been described above and description thereof will not be repeated. In the following, this optical disk apparatus will be described in more detail.

In the aforementioned optical disk apparatus, for example, in writing data into optical disk 401, laser light is emitted as signal light from semiconductor laser device 402 to optical disk 401. This signal light is rendered to a parallel beam by a collimate lens 403, transmitted through a beam splitter 404, has the polarization state adjusted by a $\lambda/4$ polarization plate 405, and then condensed at the surface of optical disk 401 by an objective lens 406 for laser light radiation.

In the optical disk apparatus as described above, when data recorded on optical disk 401 is read, laser light having no data signal follows the same path as in writing data and irradiates the surface of optical disk 401. The laser light reflected on the surface of optical disk 401 passes though objective lens 406 for laser light radiation and $\lambda/4$ polarization plate 405, has the direction of the optical axis changed by 90° at beam splitter 404, and then condensed on the surface of a light receiving element 408 for signal detection by an objective lens 407 for reproduction light. Light receiving element 408 for signal detection converts a data signal represented by the laser light into an electrical signal, which is then output to a signal light reproduction circuit 409. The above-noted electrical signal is reproduced into an original signal by signal light reproduction circuit 409.

The optical disk apparatus in the present embodiment which is capable of the aforementioned operation includes, as a light emitting element, semiconductor laser device 402 in accordance with the present invention having high reliability in high power operation as compared with the conventional semiconductor laser device and therefore achieves faster writing to optical disk 401 and a stable operation.

In the present embodiment, application of the semiconductor laser device of the present invention to a recording/reproduction type optical disk apparatus has been described. Alternatively, the semiconductor laser device of the present invention which allows for oscillation, for example, at a wavelength of 780 nm may be applied to an optical disk recording apparatus or an optical disk reproduction apparatus using the same wavelength of 780 nm, or an optical disk apparatus using any other wavelength band (for example, a 650 nm band, a 400 nm band).

Although typical embodiments of the present invention have been described above, the present invention is not limited to the aforementioned embodiments and a variety of modifications may be made, for example, to the configuration of the semiconductor laser device, the optical transmission module or the optical disk apparatus without departing from the sprit of the invention, as a matter of course.

EXAMPLE

Example 1

In this example, in a similar method as in the first embodiment, a semiconductor laser device having a configuration shown in FIG. 1 and FIG. 9 was fabricated.

<Laser Wafer Formation Step>

First, as shown in FIG. 2, buffer layer 102 made of n-GaAs (layer thickness: 0.5 μm), first lower cladding layer 103 made of n-$Al_{0.5}Ga_{0.5}As$ (layer thickness: 1.8 μm), lower guide layer 104 made of n-$Al_{0.4}Ga_{0.6}As$ (layer thickness: 0.1 μm), active layer 105 having a multiple quantum well structure, upper guide layer 106 made of p-$Al_{0.4}Ga_{0.6}As$ (layer thickness: 0.1 μm), first upper cladding layer 107 made of p-$Al_{0.5}Ga_{0.5}As$ (layer thickness: 0.15 μm), etching stop layer 108 made of p-GaAs (layer thickness: 4 nm), second upper cladding layer 109 made of p-$Al_{0.5}Ga_{0.5}As$ (layer thickness: 1.28 μm), and cap layer 110 made of p-GaAs (layer thickness: 0.75 μm) were successively crystal-grown on substrate 101 made of n-GaAs having (100) plane by MOCVD method.

Active layer 105 was formed to have a multiple quantum well structure having alternately stacked two $In_{0.065}Ga_{0.935}As$ quantum well layers (each having a layer thickness of 4.6 nm) and three $Al_{0.15}Ga_{0.85}As$ barrier layers (each having a layer thickness of 21.5 nm, 7.9 nm, 21.5 nm from the substrate).

Next, resist mask 117 (mask width: 6 μm) was fabricated by a photolithography step at a part where a mesa-stripe portion was to be formed, such that a stripe direction had (01-1) direction.

Then, as shown in FIG. 3, using the above-noted resist mask 117, cap layer 110 and second upper cladding layer 109 were partially etched to form mesa-stripe portion 121. The etching was performed in two steps using an etching liquid including a mixture of sulfuric acid and hydrogen peroxide solution (the volumetric mixture ratio was sulfuric acid:hydrogen peroxide solution:water=1:8:50, the liquid temperature was 10° C.) and hydrofluoric acid (the liquid temperature was 10° C.). The etching was performed until immediately above etching stop layer 108. The total etching time of the two-steps as described above was set to 240 seconds, the etching depth was set to 2.03 μm, and the width of the lowermost portion of the mesa-stripe portion was set to about 3.0 μm. After the etching, the aforementioned resist mask 117 was removed.

Thereafter, as shown in FIG. 4, first current block layer 111 made of n-$Al_{0.7}Ga_{0.3}As$ (layer thickness: 1.0 μm), second current block layer 112 made of n-GaAs (layer thickness: 0.3 μm) and planarization layer 113 made of p-GaAs (layer thickness: 0.65 μm) were successively formed by organic-metal crystal growth to form a light/current constricting region. Thereafter, resist mask 118 was formed only on opposite sides of the aforementioned mesa-stripe portion 121 by a photolithography step.

Thereafter, the aforementioned planarization layer 113, the aforementioned second current block layer 112, the aforementioned first current block layer 111 and the aforementioned cap layer 110 on the aforementioned mesa-stripe portion 121 were partially removed by etching. This etching was performed in two steps using a mixed aqueous solution of ammonia and hydrogen peroxide solution and a mixed aqueous solution of sulfuric acid and hydrogen peroxide solution.

Then, the aforementioned resist mask 118 was removed, and contact layer 114 made of p-GaAs (layer thickness: 4.0 μm) was formed by organic-metal crystal growth. Thereafter, p-side electrode 115 was formed on the aforementioned contact layer 114 by successively stacking Ti (layer thickness: 150 nm)/Pt (layer thickness: 50 nm)/Au (layer thickness: 300 nm) using an electron beam evaporation method.

On the other hand, the back surface of the aforementioned substrate 101 (namely, that surface on which each of the semiconductor layers was not stacked) was etched to reduce the thickness from substrate 101 to p-side electrode 115 to about 100 μm. Then, n-side electrode 116 was formed on the entire back surface by successively stacking AuGe (layer thickness: 150 nm)/Ni (layer thickness: 15 nm)/Au (layer thickness: 300 nm), using a resistance heating evaporation method. Then, an alloying process for the electrode material was performed by performing a thermal process at 390° C. for one minute. Thus, a laser wafer having a cross-sectional structure shown in the schematic cross-sectional view in FIG. 1 was formed.

<Cleavage Step>

As shown in FIG. 5, in order to cleave laser wafer 130 having a cross-sectional structure shown in FIG. 1 in a surface vertical to the direction in which mesa-stripe portion 121 extended, scribe lines 131 were drawn vertically to the direction in which the aforementioned mesa-stripe portion 121 extended, at the end portion of the aforementioned laser wafer 130.

Then, starting from the aforementioned scribe line 131, laser wafer 130 was cleaved in the direction in which scribe line 131 extended. The spacing between scribe lines 131 was 500 μm. In this way, as shown in FIG. 6, laser bar 134 with a width of a resonator length, having two resonator end surfaces 132 and 133, was fabricated. The cleavage was performed in the atmosphere, at the normal atmospheric pressure, at room temperature.

<Contact Step>

Next, the aforementioned laser bar after the cleavage was left standing in a container into which 99.99 volume % nitrogen gas was fed at a flow rate of about 1 L/minute, so that resonator end surfaces 132, 133 was brought into contact with the nitrogen containing gas.

<Reflectance Control Film Formation Step>

Next, low reflection film 135 and high reflection film 136 were formed as reflectance control films on two resonator end surfaces 132, 133 of the aforementioned laser bar, respectively, using an electron beam evaporation method, while laser bar 134 was heated to 250° C. As shown in FIG. 7, one $Al_2O_3$ layer (layer thickness: 136.5 nm) was formed as low reflection film 135, and three $Al_2O_3$ layers (layer thickness: 128 nm/128 nm/225 nm in order from the semiconductor layer forming the resonator end surface) and two Si layers (layer thickness: 50 nm/50 nm) were alternately stacked as high reflection film 136. Then, as shown in FIG. 8, the aforementioned laser bar was divided for each stripe and cut off, resulting in semiconductor laser device 140 in a chip state as shown in FIG. 9. The oscillation wavelength of the semiconductor laser device was 890 nm.

The characteristic evaluation of semiconductor laser device 140 indicated that the threshold value was 25 mA and the external quantum efficiency was 1.0, with pulse current. The measurements of the reflectance of laser light at the resonator end surface on the low reflection film side and the resonator end surface on the high reflection film side were 2.4% and 95%, respectively.

Example 2

In this example, a semiconductor laser device having a configuration shown in FIG. 10 and FIG. 15 was fabricated in a similar method as in the second embodiment.

<Laser Wafer Formation Step>

Buffer layer 202 made of n-GaAs (layer thickness: 0.5 μm), first lower cladding layer 203 made of n-$Al_{0.5}Ga_{0.5}As$ (layer thickness: 2 μm), second lower cladding 204 made of n-$Al_{0.422}Ga_{0.578}As$ (layer thickness: 0.1 μm), lower guide layer 205 made of $Al_{0.25}Ga_{0.75}As$ (layer thickness: 3 nm), active layer 206 having a multiple quantum well structure, upper guide layer 207 made of $Al_{0.4}Ga_{0.6}As$ (layer thickness: 0.1 μm), first upper cladding layer lower layer 208 made of p-$Al_{0.558}Ga_{0.442}As$ (layer thickness: 0.2 μm, doping concentration: $1.35 \times 10^{18}$ $cm^{-3}$), first upper cladding layer upper layer 209 made of p-$Al_{0.558}Ga_{0.442}As$ (layer thickness: 0.1 μm, doping concentration: $1.0 \times 10^{17}$ $cm^{-3}$), etching stop layer 210 made of p-$In_{0.34}Ga_{0.66}As_{0.3}P_{0.7}$ (layer thickness: 15 nm, doping concentration: $1.0 \times 10^{17}$ $cm^{-3}$), a p-$Al_{0.5}Ga_{0.5}As$ layer (layer thickness: 1.28 μm) for forming second upper cladding layer 211, a p-GaAs layer (layer thickness: 0.2 μm, doping concentration: $3.3 \times 10^{18}$ $cm^{-3}$) for forming first contact layer 213, and a $p^{++}$-GaAs layer (layer thickness: 0.3 μm, doping concentration: $10 \times 10^{20}$ $cm^{-3}$) for forming second contact layer 214 were successively crystal-grown on substrate 201 made of n-GaAs having (100) plane by MOCVD method.

In the aforementioned active layer 206, $In_{0.1001}Ga_{0.8999}As$ well layer and $In_{0.238}Ga_{0.762}As_{0.5462}P_{0.4538}$ barrier layer were alternately arranged. The above-noted well layer included two layers, both of which each had a layer thickness of 4.6 nm. On the other hand, the above-noted barrier layer included three layers having respective layer thicknesses, for example, of 21.5 nm, 7.9 nm, 21.5 nm from substrate 201.

Next, a resist mask (mask width: 5 μm, not shown) was fabricated by a photolithography step at a part where the aforementioned mesa-stripe portion 221 was to be formed, such that a stripe direction had (01-1) direction.

Then, using the above-noted resist mask, the aforementioned $p^{++}$-GaAs layer, p-GaAs layer and p-$Al_{0.5}Ga_{0.5}As$ layer were partially etched to form mesa-stripe portion 221 formed of the aforementioned second contact layer 214, first contact layer 213 and second upper cladding layer 211. The etching for forming this mesa-stripe portion 221 was performed with an etching liquid including a mixture of sulfuric acid and hydrogen peroxide solution (the volumetric mixture ratio was, for example, sulfuric acid:hydrogen peroxide solution:water=1:8:50, the liquid temperature was 10° C.).

The etching for forming the aforementioned mesa-stripe portion 221 was first performed until immediately above etching stop layer 210. The etching time was set to 210 seconds, the total etching depth was set to 1.78 μm, the lowermost width of second upper cladding layer 211 was about 3.3 μm, and the uppermost width of second contact layer 214 was about 0.8 μm.

Then, the aforementioned resist mask was removed, and then p-side electrode 215 made of Ti (layer thickness: 50 nm)/Pt (layer thickness: 50 nm)/Au (layer thickness: 300 nm) was formed on the entire surface. Accordingly, the aforementioned p-side electrode 215 covered the upper surface and side surface of mesa-stripe portion 221 and the exposed surface of etching stop layer 210.

Next, the back surface of the aforementioned substrate 201 (namely, the surface on which each of the semiconductor layers was not formed) was etched to make the thickness from substrate 201 to p-side electrode 215 to about 100 μm. Then, n-side electrode 216 formed of AuGe (layer thickness: 100 nm)/Ni (layer thickness: 15 nm)/Au (layer thickness: 300 nm) was provided on the entire back surface of substrate 201 and was subjected to a thermal process at 390° C. for one minute. A laser wafer was obtained by the method as described above.

<Cleavage Step>

As shown in FIG. 11, in order to cleave the resulting laser wafer 230 in a surface vertical to the direction in which mesa-stripe portion 221 extended, scribe lines 231 were drawn vertically to the direction in which the aforementioned mesa-stripe portion 221 extended, at the end portion of the aforementioned laser wafer 230.

Then, starting from the aforementioned scribe line 231, laser wafer 230 was cleaved in the direction in which scribe line 231 extended. The width of scribe line 231 was 500 μm. In this way, as shown in FIG. 12, laser bar 234 with a width of a resonator length, having two resonator end surfaces 232 and 233, was fabricated. The cleavage was performed in the atmosphere, at the normal atmospheric pressure, at room temperature.

<Contact Step>

Next, the aforementioned laser bar after the cleavage was left standing in a container into which 99.99 volume % nitrogen gas was fed at a flow rate of about 1 L/minute, so that resonator end surfaces 232, 233 were brought into contact with the nitrogen containing gas.

<Reflectance Control Film Formation Step>

Thereafter, low reflection film 235 and high reflection film 236 were coated as reflectance control films on two resonator end surfaces 232 and 233, respectively, of the laser bar, using an electron beam evaporation method, while laser bar 234 was heated to 250° C. As shown in FIG. 13, one $Al_2O_3$ layer (layer thickness: 136.5 nm) was formed as low reflection film 235, and three $Al_2O_3$ layers (layer thickness: 128 nm/128 nm/225 nm in order from the semiconductor layer) and two Si layers (layer thickness: 50 nm/50 nm in order from the semiconductor layer) were alternately stacked as high reflection film 236. Then, as shown in FIG. 14, the aforementioned laser bar was divided for each stripe and cut off, resulting in semiconductor laser device 240 in a chip state as shown in FIG. 15. The oscillation wavelength of semiconductor laser device 240 was 890 nm.

The characteristic evaluation of semiconductor laser device 240 indicated that the threshold value was 25 mA and the external quantum efficiency was 1.0, with pulse current. The measurements of the reflectance of laser light at the resonator end surface on the low reflection film side and the resonator end surface on the high reflection film side were 2.4% and 95%, respectively.

Comparative Example 1

A semiconductor laser device was fabricated in a similar method as in Example 1 except that the contact step was not provided.

Comparative Example 2

A semiconductor laser device was fabricated in a similar method as in Comparative Example 1 except that the laser bar was left standing in the atmosphere, at the normal atmospheric pressure, at room temperature for two hours after the cleavage step.

Comparative Example 3

A semiconductor laser device was fabricated in a similar method as in Comparative Example 1 except that plasma radiation was performed in an ECR etching apparatus, in argon atmosphere, with the conditions of chamber pressure 0.1 mTorr, argon flow rate 40 sccm, RF frequency 2.35 GHz, RF pressure 500W, and radiation time of one hour.

<COD Level>

Figure 21:
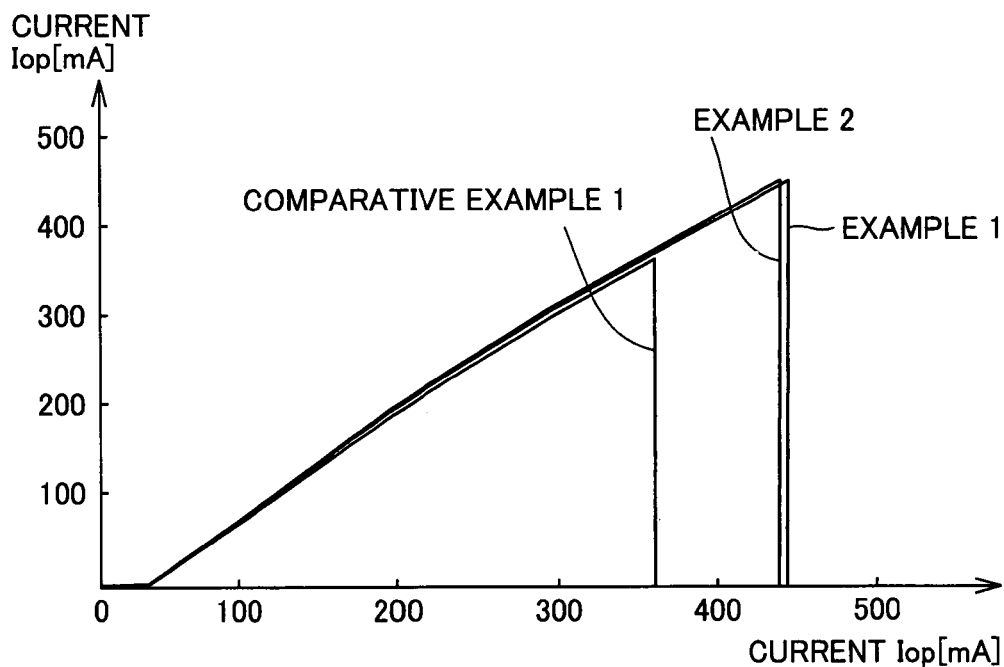
FIG. 21 shows a COD level measurement result of semiconductor laser devices fabricated in Examples 1, 2 and Comparative Example 1.

The COD level was measured for semiconductor laser devices fabricated in Examples 1, 2 and Comparative Example 1. In FIG. 21, the axis of abscissas indicates a value of current injected to the semiconductor laser device, and the axis of ordinates indicates an output value of laser light emitted from the low reflection film side of the semiconductor laser device. COD occurs at a point where the output value of laser light rapidly drops over time, and the optical power value at that point is COD level. The result shown in FIG. 21 shows that, in the semiconductor laser device in accordance with Examples 1, 2, the COD level is effectively improved as compared with Comparative Example 1, because of the contact step of the present invention.

<Reliability>

Figure 22:
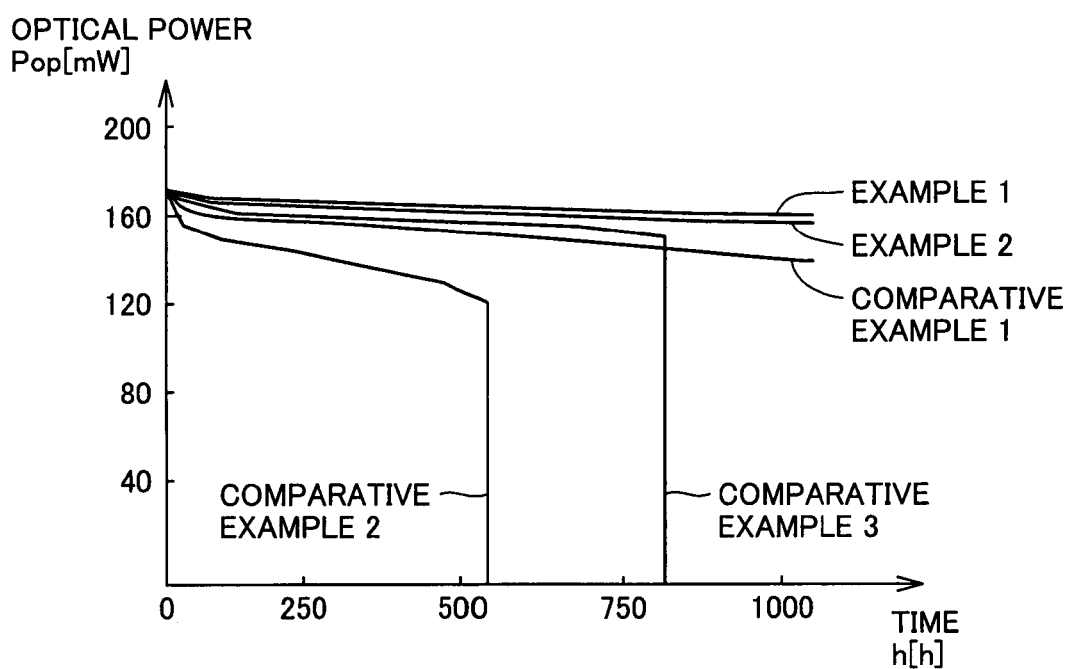
FIG. 22 shows a reliability evaluation result in semiconductor laser devices according to Examples 1, 2 and Comparative Examples 1-3.

A reliability test was conducted for the semiconductor laser devices fabricated in Examples 1, 2 and Comparative Examples 1-3. The test conditions were 25° C., 180 mA low current pulse operation. In FIG. 22, the axis of abscissas indicates a test time, and the axis of ordinates indicates an output value of laser light at a current value of the above-noted test conditions. In FIG. 22, a sudden death of the semiconductor laser device occurs at a point where an optical power rapidly drops over time.

In the semiconductor laser device in Comparative Example 2, a sudden death occurred at a point over 500 hours, and gradual degradation of optical power was observed until the sudden death. Also in the semiconductor laser device in Comparative Example 3, a sudden death occurred at a point over 750 hours, and gradual degradation of optical power was observed until the sudden death. However, in the semiconductor laser devices in Examples 1, 2 and Comparative Example 1, a sudden death was not seen even after 1000 hours passed. In the semiconductor laser devices in Examples 1, 2 and Comparative Example 1, gradual degradation of optical power was seen over time. However, in the semiconductor laser devices in Examples 1, 2, the degree of degradation was significantly low as compared with the semiconductor laser device in Comparative Example 1.

The result shown in FIG. 22 shows that, in the semiconductor laser device of the present invention including a contact step with a nitrogen containing gas, since an impurity at an interface between a resonator end surface and a reflectance control film is substituted with nitrogen, an interface state due to the impurity at the resonator end surface resulting from moisture or oxygen is restrained and therefore, deteriorated reliability as a result of COD degradation is prevented, thereby achieving a semiconductor laser device having high reliability in high power operation. Furthermore, in the semiconductor laser devices in Examples 1 and 2, the resonator end surface is heated to 250° C., so that adhesiveness between the resonator end surface and the reflectance control film is improved. This also prevents COD degradation thereby achieving a semiconductor laser device capable of stable operation at the time of high output power.

(Determination of Presence of Nitrogen Atoms at Resonator End Surface>

Figure 23:
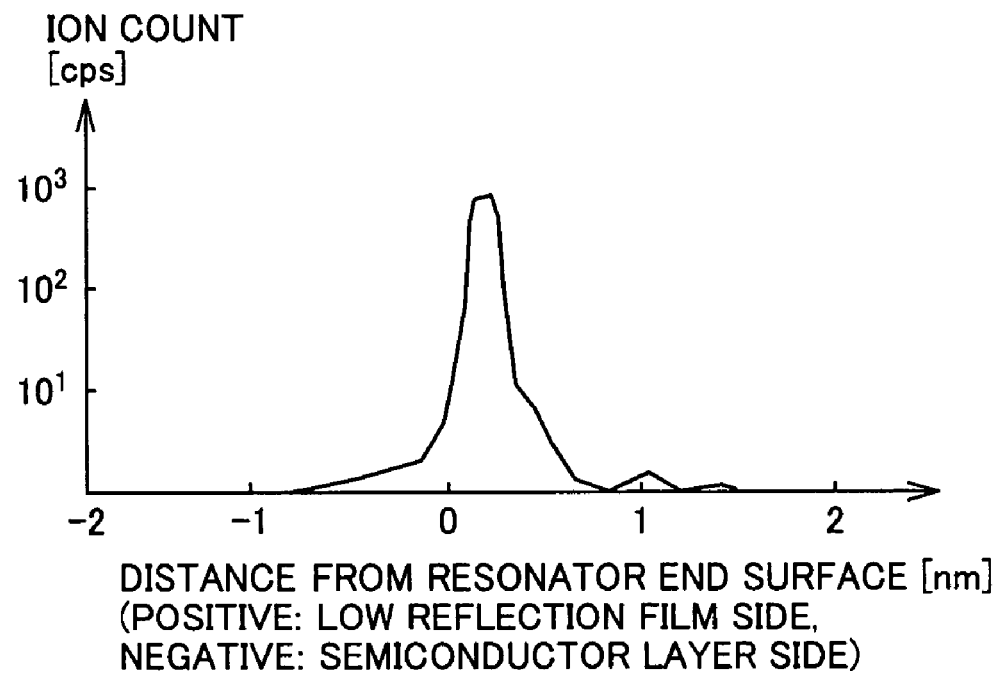
FIG. 23 shows a result of measurement of the amount of nitrogen atoms in the vicinity of a resonator end surface of the semiconductor laser device in Example 1.
Figure 24:
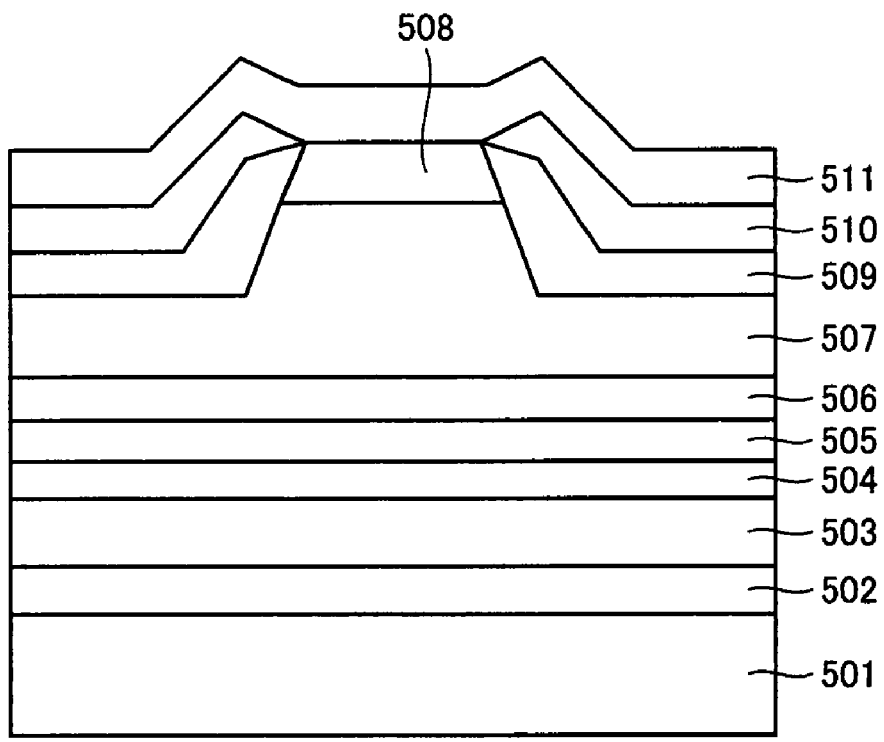
FIG. 24 is a schematic cross-sectional view illustrating a general semiconductor laser device.
Figure 25:
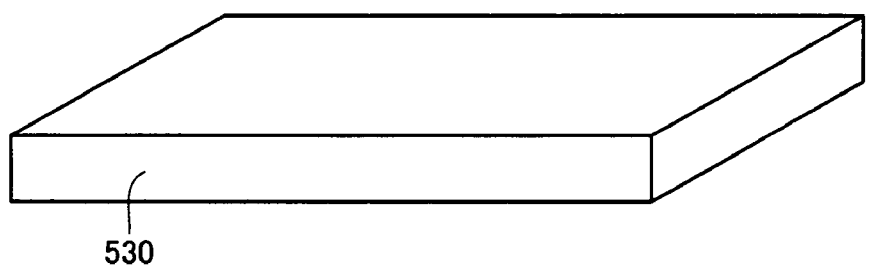
FIGS. 25-27 illustrate a method of manufacturing a general semiconductor laser device.
Figure 26:
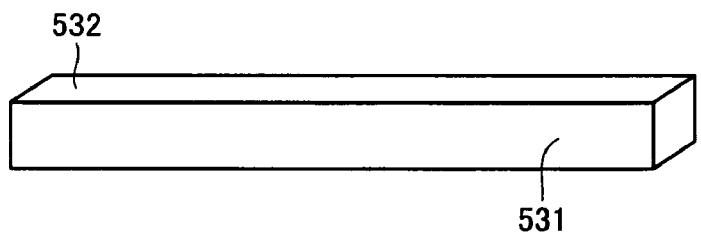
Figure 27:
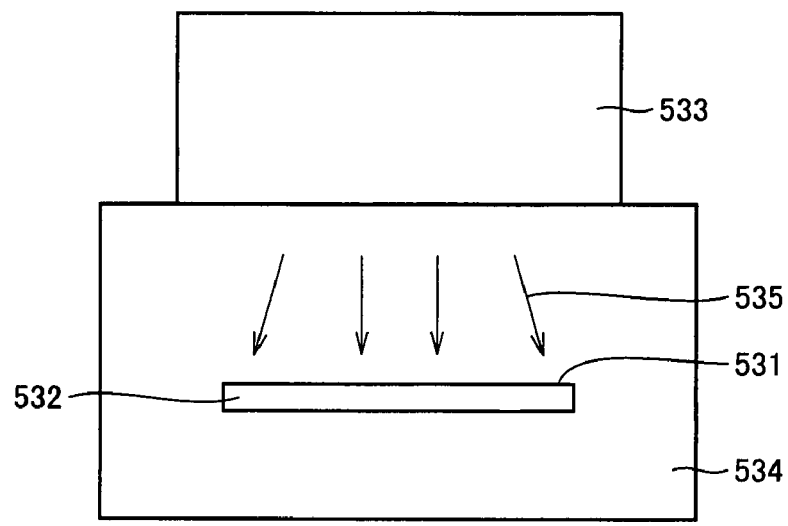

The amount of nitrogen atoms in the vicinity of the interface between resonator end surface 132 and low reflection film 135 of the semiconductor laser device in Example 1 was measured using SIMS (Secondary Ion Mass Spectrometer). As shown in FIG. 23, it was determined that nitrogen atoms were present by about $1.0 \times 10^3$ counts in the vicinity of resonator end surface 132. Based on this result, it can be understood that nitrogen atoms are present at the resonator end surface of the semiconductor laser device obtained by the manufacturing method in accordance with the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor laser device at least including a semiconductor laser element having a resonator end surface for emitting laser light and a reflectance control film, comprising:
    a laser wafer formation step of forming a laser wafer at least having a semiconductor layer to form a resonator end surface;
    a cleavage step of cleaving said laser wafer in atmosphere and forming a semiconductor laser element having said resonator end surface;
    a contact step of bringing said resonator end surface in contact with a nitrogen containing gas containing 90-100 volume % nitrogen for at least one hour; and
    a reflectance control film formation step of forming a reflectance control film in contact with said resonator end surface.

2. An optical transmission module using a semiconductor laser device obtained by the manufacturing method according to claim 1.

3. An optical disk apparatus using a semiconductor laser device obtained by the manufacturing method according to claim 1.

4. A semiconductor laser device obtained by the method of manufacturing a semiconductor laser device according to claim 1, wherein a nitrogen atom is present at an interface between said resonator end surface and said reflectance control film.

5. The semiconductor laser device according to claim 4, wherein a material forming a laser light emitting region at said resonator end surface at least includes Ga.

6. An optical transmission module using the semiconductor laser device according to claim 4.

7. An optical disk apparatus using the semiconductor laser device according to claim 4.

8. The method of manufacturing a semiconductor laser device according to claim 1, wherein in said reflectance control film formation step, said reflectance control film is formed in a state where said resonator end surface is heated.

9. A semiconductor laser device obtained by the method of manufacturing a semiconductor laser device according to claim 8, wherein a nitrogen atom is present at an interface between said resonator end surface and said reflectance control film.

10. The semiconductor laser device according to claim 9, wherein a material forming a laser light emitting region at said resonator end surface at least includes Ga.

11. The method of manufacturing a semiconductor laser device according to claim 8, wherein said heating is performed with a temperature of said resonator end surface set within a range of 200-300° C.

12. A semiconductor laser device obtained by the method of manufacturing a semiconductor laser device according to claim 11, wherein a nitrogen atom is present at an interface between said resonator end surface and said reflectance control film.

13. The semiconductor laser device according to claim 12, wherein a material forming a laser light emitting region at said resonator end surface at least includes Ga.

* * * * *